US010748491B2

(12) United States Patent
Park et al.

(10) Patent No.: US 10,748,491 B2
(45) Date of Patent: Aug. 18, 2020

(54) ELECTRONIC DEVICE INCLUDING INACTIVE AREA

(71) Applicant: Samsung Electronics Co., Ltd., Gyeonggi-do (KR)

(72) Inventors: Junk Sik Park, Gyeonggi-do (KR); Jae Young Shin, Gyeonggi-do (KR); Woon Geun Kwak, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/121,905

(22) Filed: Sep. 5, 2018

(65) Prior Publication Data

US 2019/0073961 A1 Mar. 7, 2019

(30) Foreign Application Priority Data

Sep. 6, 2017 (KR) .................. 10-2017-0114045

(51) Int. Cl.
*G09G 3/3266* (2016.01)
*G02F 1/1362* (2006.01)
(Continued)

(52) U.S. Cl.
CPC ......... *G09G 3/3266* (2013.01); *G02F 1/1362* (2013.01); *G02F 1/136209* (2013.01);
(Continued)

(58) Field of Classification Search
CPC .. G09G 3/3266; G09G 3/2092; G09G 3/3225; G09G 2310/0267;
(Continued)

(56) References Cited

U.S. PATENT DOCUMENTS 6,433,791 B2   8/2002  Selli et al.
7,196,353 B2   3/2007  Murade
(Continued)

FOREIGN PATENT DOCUMENTS

EP   2447766 A1    5/2012
JP   2005-77636 A  3/2005
(Continued)

OTHER PUBLICATIONS

International Search Report dated Dec. 17, 2018.
European Search Report dated Apr. 30, 2020.

*Primary Examiner* — Kent W Chang
*Assistant Examiner* — Andrew Lee
(74) *Attorney, Agent, or Firm* — Cha & Reiter, LLC.

(57) ABSTRACT

Disclosed is an electronic device. The electronic device comprises a cover glass, a back cover facing the cover glass, a housing surrounding a space between the cover glass and the back cover, a bezel surrounding an edge of a plane arranged below the cover glass; a display panel including a first area that is exposed through an area of the cover glass not overlapping the bezel and a second area that surrounds the first area and is arranged below the bezel, a first group of screen pixels arranged along an edge of the first area; a second group of screen pixels arranged in an area except for the first area; a display driver integrated circuit electrically connected to the second group pixels, and a processor controlling, through the display driver integrated circuit, whether to allow the second group pixels to emit light, wherein the first group screen pixels are not electrically connected to the display driver integrated circuit, and wherein the second area includes a gap for compensating a tilt between the cover glass and the display panel when the cover glass is coupled to the display panel.

20 Claims, 15 Drawing Sheets

(51) Int. Cl.
- G11C 19/18 (2006.01)
- G11C 19/28 (2006.01)
- G09G 3/3225 (2016.01)
- G09G 3/20 (2006.01)
- G02F 1/1333 (2006.01)

(52) U.S. Cl.
CPC ..... *G02F 1/136286* (2013.01); *G09G 3/2092* (2013.01); *G09G 3/3225* (2013.01); *G11C 19/184* (2013.01); *G11C 19/28* (2013.01); *G02F 2001/133388* (2013.01); *G09G 2300/0413* (2013.01); *G09G 2300/0426* (2013.01); *G09G 2310/0232* (2013.01); *G09G 2310/0267* (2013.01)

(58) Field of Classification Search
CPC ... G09G 2310/0232; G09G 2300/0413; G09G 2300/0426; G11C 19/28; G11C 19/184; G02F 1/136209; G02F 1/136286; G02F 2001/133388
See application file for complete search history.

(56) References Cited

U.S. PATENT DOCUMENTS

| | | | |
|---|---|---|---|
| 8,467,177 | B2 | 6/2013 | Mathew et al. |
| 9,372,505 | B2 | 6/2016 | Mathew et al. |
| 9,825,112 | B2 | 11/2017 | Zou |
| 9,905,161 | B2 | 2/2018 | Jeon |
| 2002/0000997 | A1 | 1/2002 | Selli et al. |
| 2005/0078240 | A1 | 4/2005 | Murade |
| 2009/0115933 | A1 | 5/2009 | Mimura et al. |
| 2010/0118480 | A1 | 5/2010 | Lu et al. |
| 2015/0054800 | A1 | 2/2015 | Kim et al. |
| 2015/0103284 | A1* | 4/2015 | Nagasawa ......... G02F 1/134336 349/46 |
| 2015/0220206 | A1* | 8/2015 | Knausz ................. G06F 3/044 345/174 |
| 2016/0070130 | A1 | 3/2016 | Yuminami et al. |
| 2016/0223862 | A1* | 8/2016 | Kang .................. G02B 6/0031 |
| 2016/0379558 | A1 | 12/2016 | Jeon |
| 2017/0033311 | A1 | 2/2017 | Baek |
| 2017/0092698 | A1 | 3/2017 | Zou |
| 2017/0131601 | A1* | 5/2017 | Jiang ................. G02F 1/133514 |
| 2017/0153513 | A1 | 6/2017 | Tamaki et al. |
| 2018/0063466 | A1 | 3/2018 | Bae et al. |
| 2019/0244395 | A1 | 8/2019 | Hyun et al. |
| 2019/0324311 | A1 | 10/2019 | Yuminami et al. |

FOREIGN PATENT DOCUMENTS

| | | |
|---|---|---|
| KR | 10-2014-0002392 A | 1/2014 |
| KR | 10-2015-0024073 A | 3/2015 |
| KR | 10-2017-0002716 A | 1/2017 |
| KR | 10-2017-0063009 A | 6/2017 |
| KR | 10-2017-0097842 A | 8/2017 |
| WO | 2017/142263 A1 | 8/2017 |

* cited by examiner

ELECTRONIC DEVICE INCLUDING INACTIVE AREA

CROSS-REFERENCE TO RELATED APPLICATION(S)

This application is based on and claims priority under 35 U.S.C. § 119 to Korean Patent Application No. 10-2017-0114045, filed on Sep. 6, 2017, in the Korean Intellectual Property Office, the disclosure of which is incorporated by reference herein its entirety.

BACKGROUND

1. Field

The present disclosure relates to a technology for improving a design of an electronic device.

2. Description of Related Art

With the development of mobile communication technologies, electronic devices including displays such as smartphones and wearable devices have been widely used. Such an electronic device may include a cover glass for protecting a display from an external impact. The cover glass may be arranged on the display, and the display may be exposed through the cover glass.

When the electronic device is viewed from above the cover glass, the cover glass may be obliquely coupled to the display. While the degree that the cover glass is oblique (or tilted) may be to small to be recognized by a person, due to the tilt, it may be extremely difficult to match the cover glass with other parts (e.g., housing). Accordingly, there may be required a gap for compensating the tilt between the display and the cover glass.

In addition, the display may include a plurality of screen pixels, a display driver circuit for controlling the screen pixels, and a plurality of lines connecting the screen pixels to the display driver circuit. Since the lines must extend from the screen pixels and connect to the display driver circuit, the display may require a gap through which the wires can pass.

The above information is presented as background information only to assist with an understanding of the present disclosure. No determination has been made, and no assertion is made, as to whether any of the above might be applicable as prior art with regard to the present disclosure.

SUMMARY

A display can include a black masking and an active area. When viewed from above the cover glass, a gap may be located between a black masking (or a bezel) and an active area. Since any images are not output through the black masking but an image is output through the active area, a boundary line corresponding to the gap may be displayed between the black masking and the active area. Accordingly, a user may recognize the gap, and the gap may deteriorate the aesthetics of the user.

Aspects of the present disclosure are to address at least the above-mentioned problems and/or disadvantages and to provide at least the advantages described below. Accordingly, an aspect of the present disclosure is to provide an electronic device.

In accordance with an aspect of the disclosure, an electronic device comprises a cover glass; a back cover facing the cover glass; a housing surrounding a space between the cover glass and the back cover; a bezel surrounding an edge of a plane arranged below the cover glass; a display panel including a first area that is exposed through an area of the cover glass not overlapping the bezel and a second area that surrounds the first area and is arranged below the bezel; a first group of screen pixels arranged along an edge of the first area; a second group of screen pixels arranged in an area except for the first area; a display driver integrated circuit electrically connected to the second group pixels; and a processor controlling, through the display driver integrated circuit, whether to allow the second group pixels to emit light, wherein the first group screen pixels are not electrically connected to the display driver integrated circuit, and wherein the second area includes a gap for compensating a tilt between the cover glass and the display panel when the cover glass is coupled to the display panel.

In accordance with an aspect of the disclosure, an electronic device comprises a cover glass; a back cover facing the cover glass; a housing surrounding a space between the cover glass and the back cover; an upper end bezel arranged on one end of a plane arranged below the cover glass and having a specified shape; a lower end bezel arranged on an opposite end of the plane arranged below the cover glass; a display panel covered by and exposed through the cover glass and including a first area corresponding to the specified shape and a second area between the first area and the lower end bezel, a first group screen pixels arranged in the first area; a second group screen pixels arranged in the second area; and a display driver integrated circuit electrically connected to the first group pixels and the second group pixels, wherein the display driver integrated circuit transmits a disenable signal to the first group pixels to turn off the first group pixels.

In accordance with an embodiments, an electronic device comprises a display panel including a display area including a plurality of pixels, a non-display area in which a plurality of lines connected to the plurality of pixels are arranged, and a peripheral area in which one or more pixels are arranged between the display area and the non-display area; and a display driver integrated circuit configured to drive the display panel, wherein the display driver integrated circuit is configured to provide contents for display in the display area, and not provide contents to display in the peripheral area while the contents are displayed in the display area.

According to the embodiments of the present disclosure, the design of an electronic device may be improved.

In addition, various effects that are directly or indirectly understood through the present disclosure may be provided.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
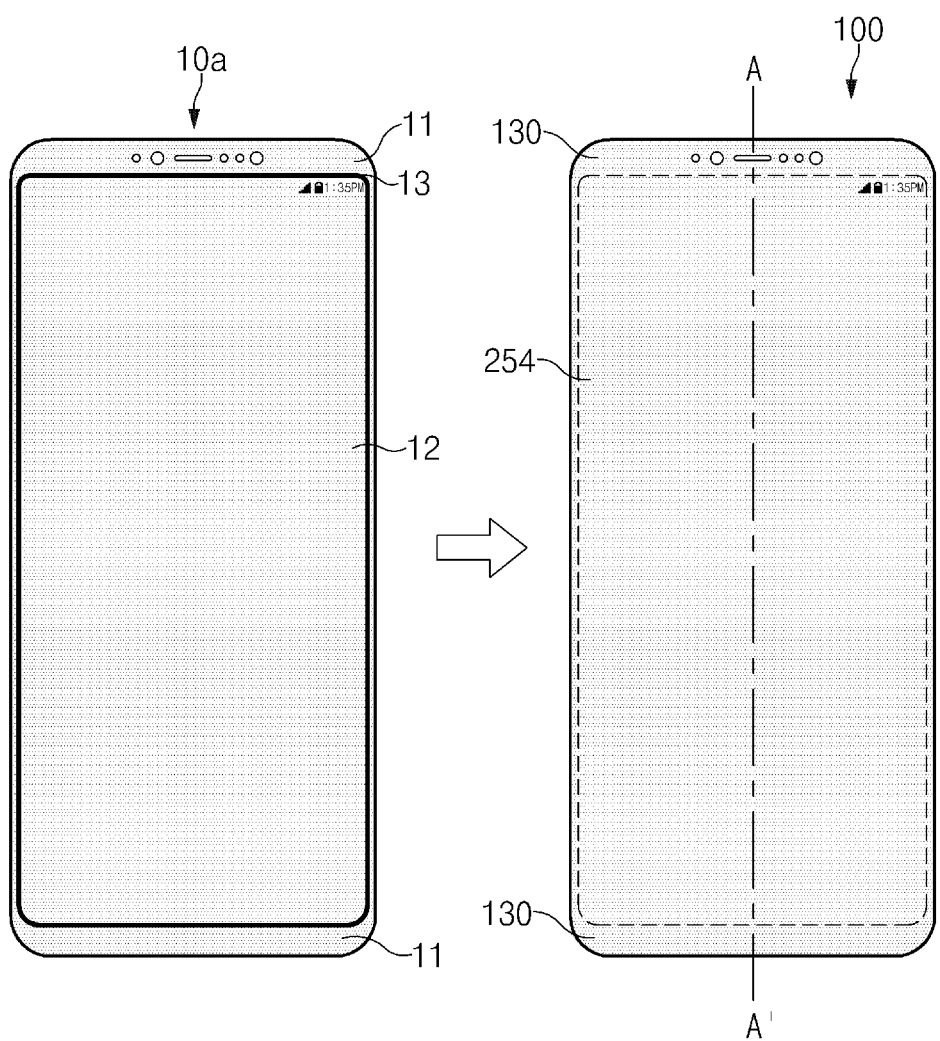
FIG. 1 is a view illustrating a front part of an electronic device according to a comparative example and a front part of an electronic device according to an embodiment.

FIG. 1 is a view illustrating a front part of an electronic device according to a comparative example and a front part of an electronic device according to an embodiment.

Referring to FIG. 1, an electronic device 10a according to a comparative example may include a bezel 11 and an active area 12. The active area 12 may mean an area through which light is output in a display panel (e.g., reference numeral 160 of FIG. 2). A specified space 13 may be located between the bezel 11 and the active area 12. The space may include a gap for compensating a tilt between a cover glass and the display panel when the cover glass is coupled to the display panel or for wiring in a panel. The gap may be equal to or larger than a specified width, and the space may be dark, while the bezel 11 and the active area 12 may have a certain color. Thus, a boundary line 13 corresponding to the space may be displayed between the bezel 11 and the active area 12.

Figure 2A:
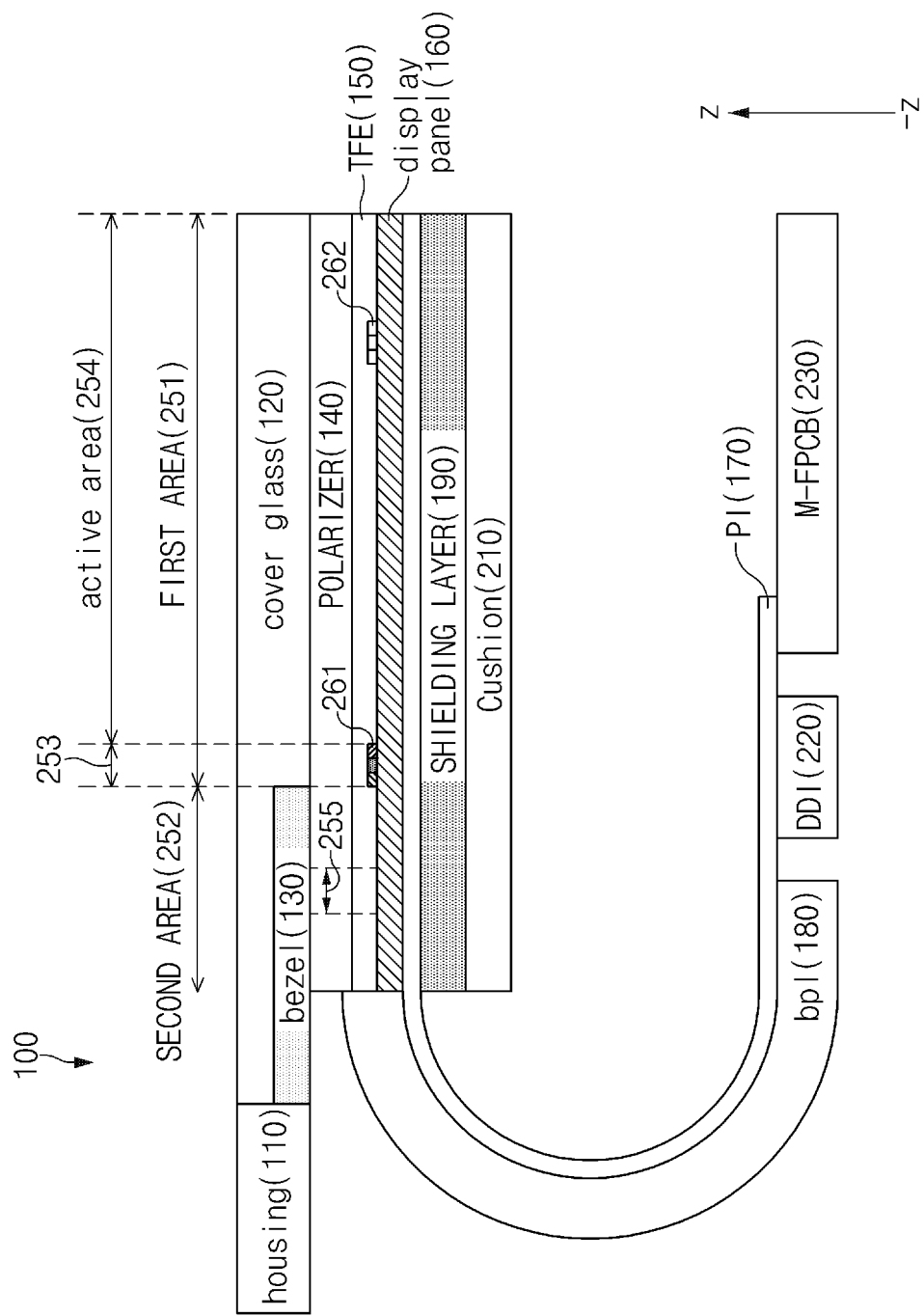
FIG. 2A is a sectional view of an electronic device according to an embodiment.

An electronic device 100 according to an embodiment may include a bezel 130, an active area 254, and dummy screen pixels (e.g., reference numeral 261 of FIG. 2A).

The bezel 130 may form the a portion of an outer surface of the electronic device 100. For example, the bezel 130 may be arranged at an edge of a front surface of the electronic device 100, thereby forming a portion of the front surface of the electronic device 100.

The active area 254 may be exposed through the front surface of the electronic device 100. The electronic device 100 may output contents (e.g., a text, an image, a video, an icon, a widget, a symbol, or the like) or receive a touch input (e.g., a touch, a gesture, a hovering, or the like) through the active area 254.

Illustrated in FIG. 2A, dummy screen pixels 261 may be arranged between the bezel 130 and the active area 254. For example, when viewed from the front of the electronic device 100, the dummy screen pixels 261 may be arranged along a line between the bezel 130 and the active area 254. In other words, the dummy screen pixels 261 may be arranged at positions corresponding to the boundary line 13 of the electronic device 10a according to the comparative example.

According to an embodiment, the dummy screen pixels 261 may be substantially the same as screen pixels arranged in the active area 254. Thus, when viewed from the front of the electronic device 100, the dummy pixels and other pixels may look the same and the boundary line 13 may not be visible between the bezel 130 and the active area 254. Since the boundary line 13 is not exposed through the front surface of the electronic device 100, the electronic device 100 has an improved appearance.

Figure 2B:
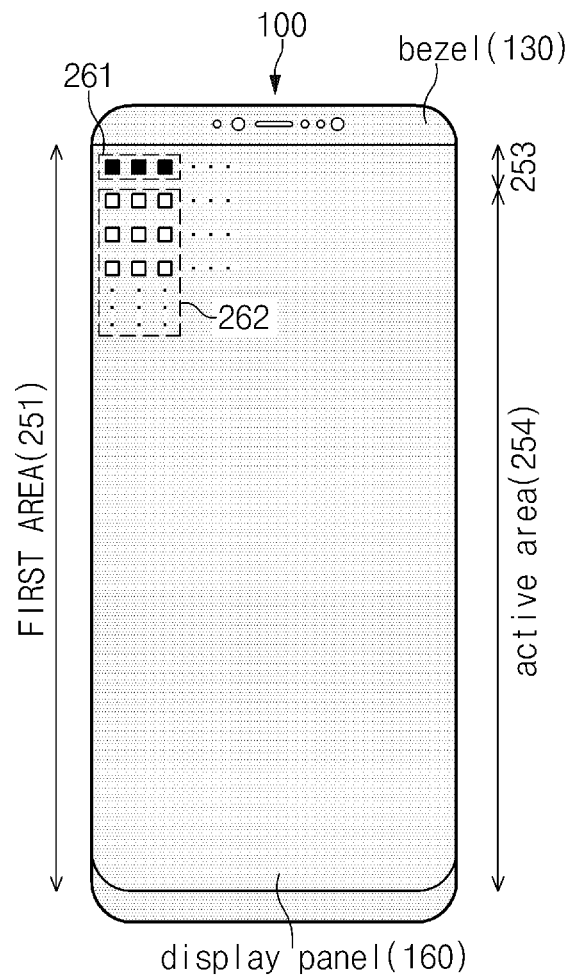
FIG. 2B is a plane view of an electronic device according to an embodiment.

FIG. 2A is a sectional view of an electronic device according to an embodiment. FIG. 2B is a plane view of an electronic device according to an embodiment. FIG. 2A is a sectional view taken line A-A' of the electronic device 100 shown in FIG. 1. FIG. 2B is a plane view of the electronic device when viewed from above a cover glass 120.

Referring to FIGS. 2A and 2B, the electronic device 100 includes a housing 110, the cover glass 120, the bezel 130, a polarizer 140, a thin film encapsulation (TFE) 150, a display panel 160, a polyimide (PI) film 170, a bending protect layer (BPL) 180, a shielding layer 190, a cushion 210, a display driver circuit (display driver IC: DDI) 220, and a module-flexible printed circuit board (M-FPCB) 230.

The housing 110 may form a side appearance of the electronic device 100. In addition, the housing 110 may protect components included in the electronic device 100. For example, the polarizer 140, the display panel 160 and the like may be mounted in the housing 110 and the housing 110 may protect the components from external impact.

The cover glass 120 may enable the light generated from the display to transmit therethrough. In addition, a user may touch the cover glass 120 with a part (e.g., a finger) of the body to perform a touch (including a touch using an electronic pen). For example, the cover glass 120 may be formed of tempered glass, reinforced plastic, a flexible polymeric material, or the like. According to an embodiment, the cover glass 120 may be referred to as a glass window.

The bezel 130 may be arranged in the −z direction (the −z direction is orthogonal to the drawing sheet) of the cover glass 120. For example, the bezel 130 may be arranged at an edge of a plane arranged in the −z direction of the cover glass 120 to form a front appearance (or a z-directional appearance) of the electronic device 100.

The polarizer 140 (or the polarizing film) can transmit only light that vibrates in any one direction of the light input through the cover glass 120. For example, the polarizer 140 may pass only vertically oscillating light and block horizontally oscillating light.

The TFE 150 may be arranged in the −z direction of the polarizer 140. The TFE 150 may protect the dummy screen pixel 261 and active area screen pixel 262 arranged on the display panel 160. In addition, a touch pattern may be formed on a top end of the TFE 150 to replace a touch panel.

The display panel 160 may be provided with a plurality of lines and a plurality of screen pixels 261 and 262. For example, a plurality of gate lines and a plurality of data lines may be arranged on the display panel 160 and may cross each other. The screen pixels 262 may emit light based on signals provided from the gate lines and the data lines.

According to an embodiment, the display panel 160 may include first and second areas 251 and 252. The first area 251 may mean an area of the display panel 160 exposed through the cover glass 120. The second area 252 may be an area of the display panel 160 that is not exposed to an outside of the electronic device 100 by the bezel 130.

According to an embodiment, the screen pixels 261 and 262 may be arranged in the first area 251. The screen pixels 261 and 262 may include a first and second group of screen pixels 261 and 262. The first group of screen pixels 261 may be arranged on the display panel 160, and may include pixels that are not electrically connected to the DDI 220. Since the first group of screen pixels 261 are not electrically connected to the DDI 220, the first group of screen pixels 261 may not emit light. Thus, an inactive area 253 in which the first group of screen pixels 261 are arranged may appear black when viewed from above the cover glass 120. In the present disclosure, the first group of screen pixels 261 may be referred to as dummy screen pixels.

According to an embodiment, at least a part of the first group of screen pixels 261 may be arranged in the −z direction of the bezel 130. For example, the bezel 130 and the at least a part of the first group pixels 261 may overlap with each other when viewed from above the electronic device 100.

The second group of screen pixels 262 may be arranged on the display panel 160 and electrically connected to the DDI 220. The second group of screen pixels 262 may emit light based on a signal received from the DDI 220. Accordingly, various contents (e.g., pictures, moving pictures, and the like) may be output through the active area 254 in which the second group of screen pixels 262 are arranged.

According to an embodiment, by arranging the dummy screen pixels 261 in the inactive area 253, the boundary line 13 between the bezel 130 and the active area 254 is not visible to the outside. Specifically, when the bezel 130 is black and contents are not output through the active area 254, the entire front surface of the electronic device 100 may look substantially black. Thus, the boundary line 13 is not visible on the front surface of the electronic device 100, thereby improving the appearance of the electronic device 100.

According to an embodiment, when the cover glass 120 is coupled to the display panel 160, the bezel 130 on the second area 252 may cover a line of the display panel 160 and a panel part of the display panel 160, such as the bending protect layer (BPL) 180, the module-flexible printed circuit board (M-FPCB) 230, and the like, such that the line and the panel part are visible from the outside. The second area 252 may include a gap 255 for compensating for the tilt between the cover glass 120 and the display panel 160 or for wiring in the panel.

The PI film 170 may be arranged in the −z direction of the display panel 160. The PI film 170 may include lines for supplying power and/or signals to the display panel 160. According to an embodiment, the PI film 170 may be formed of a bendable material and extend from one end of the display to the M-FPCB 230.

The BPL 180 is attached to a bent area of the PI film 170 to prevent the PI film 170 from being broken (or cracking).

The shielding layer 190 may be arranged between the display panel 160 and a PCB (not shown). The shielding layer 190 may be formed of copper (Cu) or graphite to prevent electromagnetic interference between the display panel 160 and the PCB.

The cushion 210 may be arranged in the −z direction of the shielding layer 190. The cushion 210 may include at least one of a light shielding layer (e.g., an EMBO layer) and a buffer layer (e.g., a sponge layer). The cushion 210 may protect other components in the electronic device 100 by absorbing external impact.

The DDI 220 may be arranged in an area of the PI film 170. The DDI 220 may control the display panel 160 through the PI film 170. For example, the DDI 220 may allow an area of the display panel 160 to emit light.

The M-FPCB 230 may be electrically connected to an area of the PI film 170. For example, the M-FPCB 230 may be electrically connected to a conductive pattern (or a line) formed on the PI film 170.

In the present disclosure, the details described in FIGS. 1, 2A and 2B may be equally applied to the components having the same reference numerals as those of the electronic device 100 illustrated in FIGS. 1, 2A and 2B.

Figure 3A:
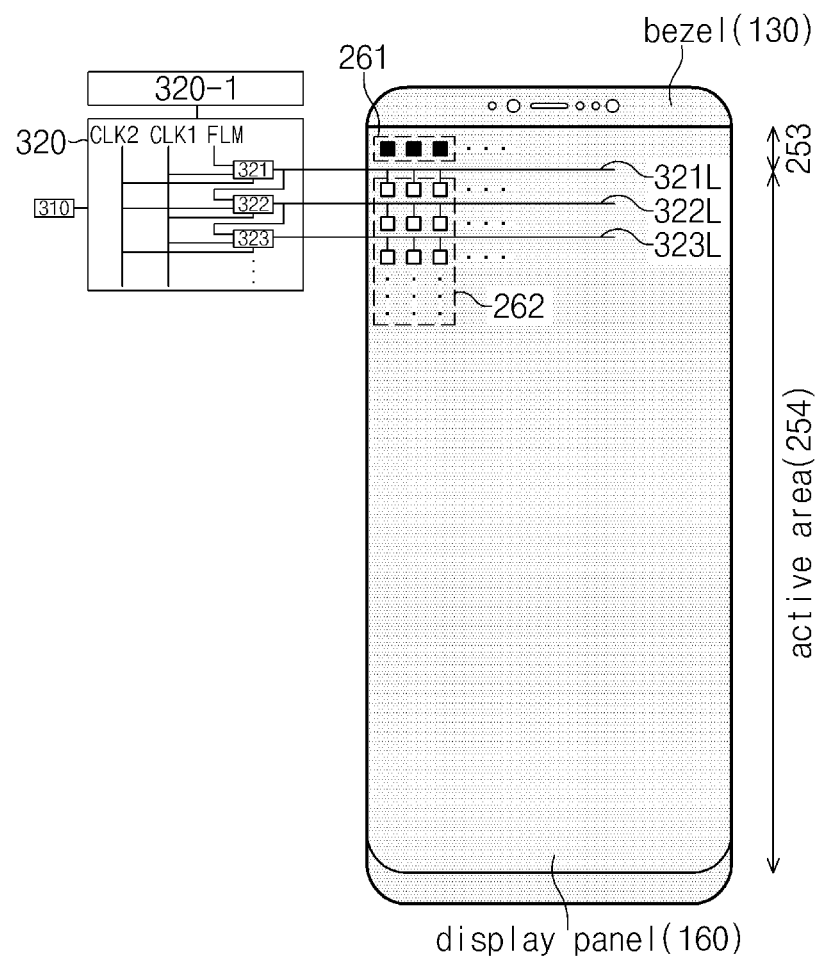
FIG. 3A is a view illustrating a coupling relation between first group pixels and other components according to an embodiment.
Figure 3B:
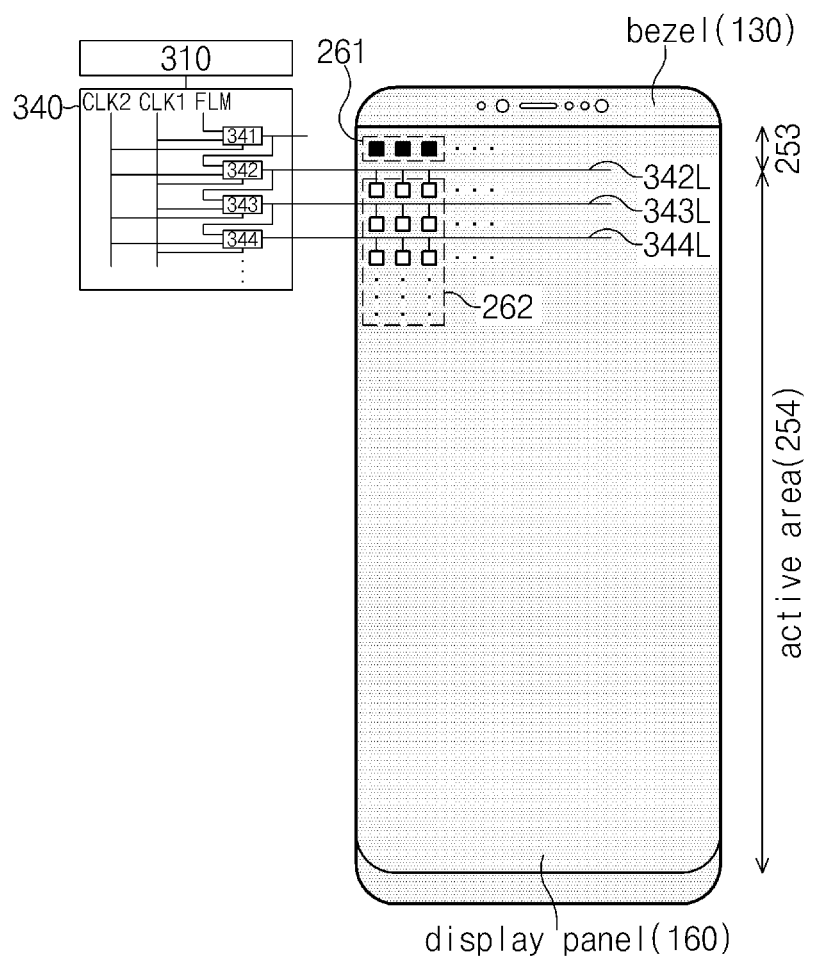
FIG. 3B is a view illustrating a coupling relation between first group pixels and other components according to another embodiment.

FIG. 3A is a view illustrating a coupling relation between first group pixels and other components according to an embodiment. FIG. 3B is a view illustrating a coupling relation between first group pixels and other components according to another embodiment. FIGS. 3A and 3B relate to an embodiment for implementing the electronic device 100 without the boundary line 13 illustrated in FIG. 1.

Referring to FIG. 3A, the electronic device 100 may include a processor (e.g., an application processor) 310 and a gate driver 320. The gate driver 320 may include a plurality of stages 321, 322, and 323. The processor 310 (or a timing controller included in the DDI 220) may be electrically connected to each of the stages 321, 322 and 323 and may control the gate driver 320 such that the gate driver 320 transmits a gate signal.

According to an embodiment, the stages 321, 322, and 323 may not be connected to the first group of screen pixels 261. For example, any stages may not exist on the line on which the first group of screen pixels 261 are arranged. Since the first group of screen pixels 261 are not connected to any stages, the first group pixels 261 may not emit light.

Each of the stages 321, 322, and 323 may be electrically connected to the second group of screen pixels 262. For example, the first stage 321 is electrically connected to the screen pixels arranged on a first gate line 321L, and the second stage 322 is electrically connected to the pixels arranged on a second gate line 322L. Since the second group of screen pixels 262 and the stages 321, 322 and 323 are connected to each other, the gate driver 320 may transmit a gate signal to the second group of screen pixels 262, such that the second group of screen pixels 262 emit light.

According to an embodiment, the electronic device 100 may further include an additional gate driver 320-1. The additional gate driver 320-1 may be placed on the line on which the first group of screen pixels 261 are arranged, but might not be connected to the first group pixels 261. For example, the electronic device 100 might not include a line for connecting the additional gate driver 320-1 and the first group pixels 261. The additional gate driver 320-1 illustrated in FIG. 3A is exemplary and the electronic device 100 might not include the additional gate driver 320-1.

Referring to FIG. 3B, the electronic device 100 may include a gate driver 340 that is not connected to the first group screen pixels 261. For example, a first stage 341 may be arranged on the line on which the first group of screen pixels 261 are arranged. However, since the electronic device 100 does not include the line connecting the first group of screen pixels 261 and the first stage 341, the first group of screen pixels 261 and the first stage 341 may not be electrically connected to each other.

Except for the first stage 341, stages 342, 343 and 344 may be electrically connected to the second group of screen pixels 262. For example, the second stage 342 may be electrically connected to the screen pixels arranged on a second gate line 342L among the second group pixels 262, and the third stage 343 may be electrically connected to the pixels arranged on a third gate line 343L among the second group of screen pixels 262.

The processor (or a timing controller included in the DDI 220) 310 may transmit a control signal to the gate driver 340. The control signal may allow the gate driver 340 to transmit a gate signal to the screen pixels 262 through the stages 342, 343 and 344. In this case, since the gate signal is not transmitted through the first stage 341, the first group of screen pixels 261 may not emit light. Since the gate signal is transmitted through the second to fourth stages 342 to 344, the second group of screen pixels 262 may emit light.

Figure 4:
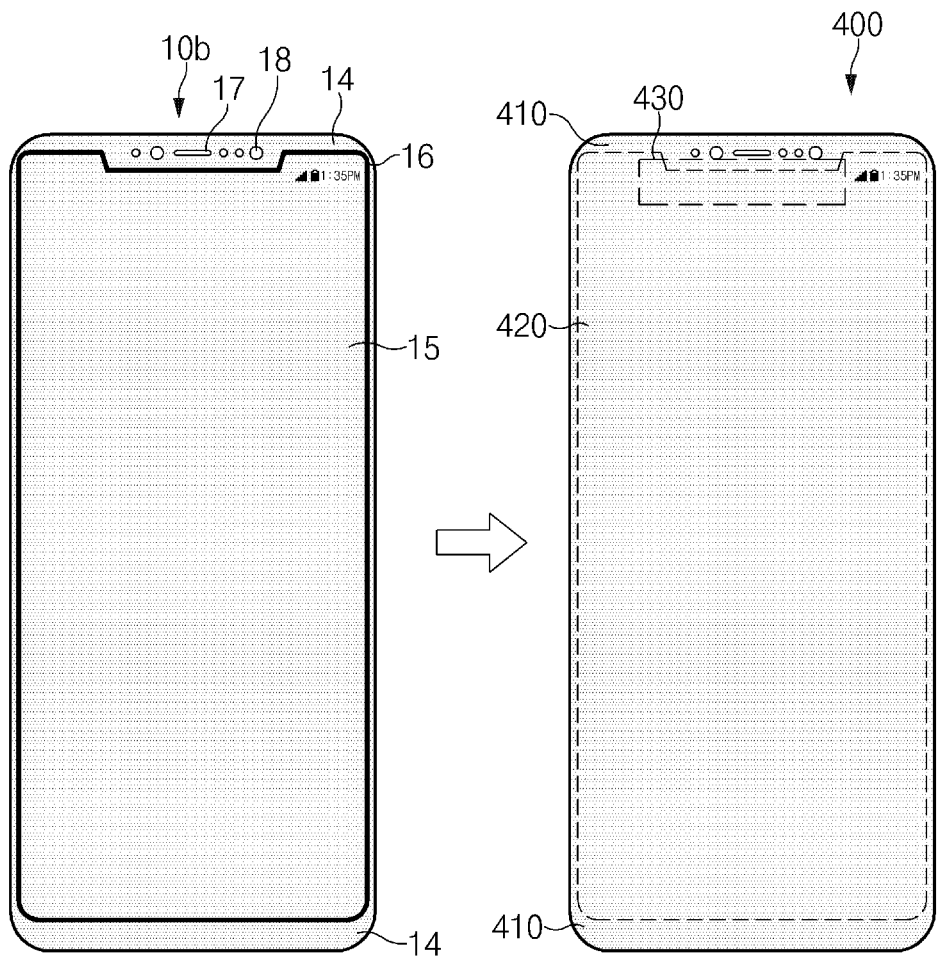
FIG. 4 is a view illustrating a front part of an electronic device according to a comparative example and a front part of an electronic device according to another embodiment.

FIG. 4 is a view illustrating a front part of an electronic device according to a comparative example and a front part of an electronic device according to another embodiment.

Referring to FIG. 4, an electronic device 10b according to a comparative example may include a bezel 14 and an active area 15. A specified space may be located between the bezel 14 and the active area 15. A shape of the space may include a groove such that a receiver 17, a camera 18, and the like may be arranged when viewed from the front of the electronic device 10b. In other words, the space may have a convex shape toward the active area 15.

The brightness of the space may be different from those of the bezel 14 and the active area 15. Thus, a boundary line 16 of dummy screen pixels as much as the space may be displayed between the bezel 14 and the active area 15.

According to another embodiment, an electronic device 400 may include a bezel 410 and an active area 420.

The bezel 410 may form an outer appearance of the electronic device 400. For example, an upper end portion of bezel 410 may have a convex shape along the boundary line 16 in the direction of the active area 420. A lower end portion of the bezel 410 may be arranged on a lower end of the electronic device 400, thereby forming the appearance of the lower end of the electronic device 400.

The electronic device 400 may include a plurality of dummy screen pixels between the active area 420 and the bezel 410. For example, when viewed from the front of the electronic device 400, the dummy screen pixels may appear substantially the same as screen pixels arranged in the active area 420. In other words, the dummy screen pixels may be arranged at the position corresponding to the boundary line 16 of the electronic device 400. Accordingly, there might not be any empty space at the position corresponding to the boundary line 16, and the boundary line 16 appear or be visible between the bezel 410 and the active area 420. Since the boundary line 16 is not visible through the front surface of the electronic device 400, the appearance of the electronic device 400 is improved.

In the present disclosure, the details described in FIG. 4 may be equally applied to the components having the same reference numerals as those of the electronic device 400 illustrated in FIG. 4.

Figure 5A:
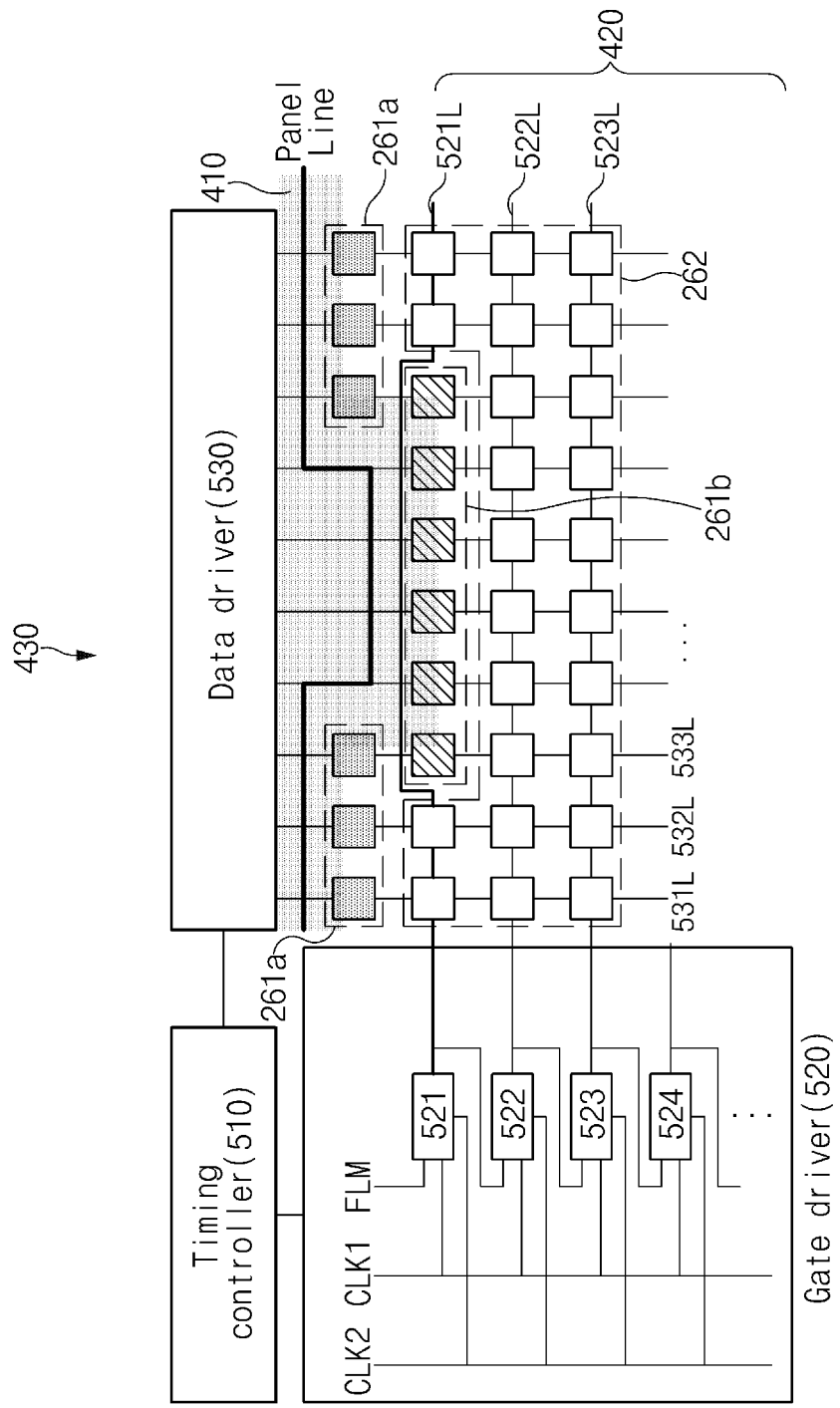
FIG. 5A is an enlarged view of an area of an electronic device according to an embodiment.
Figure 5B:
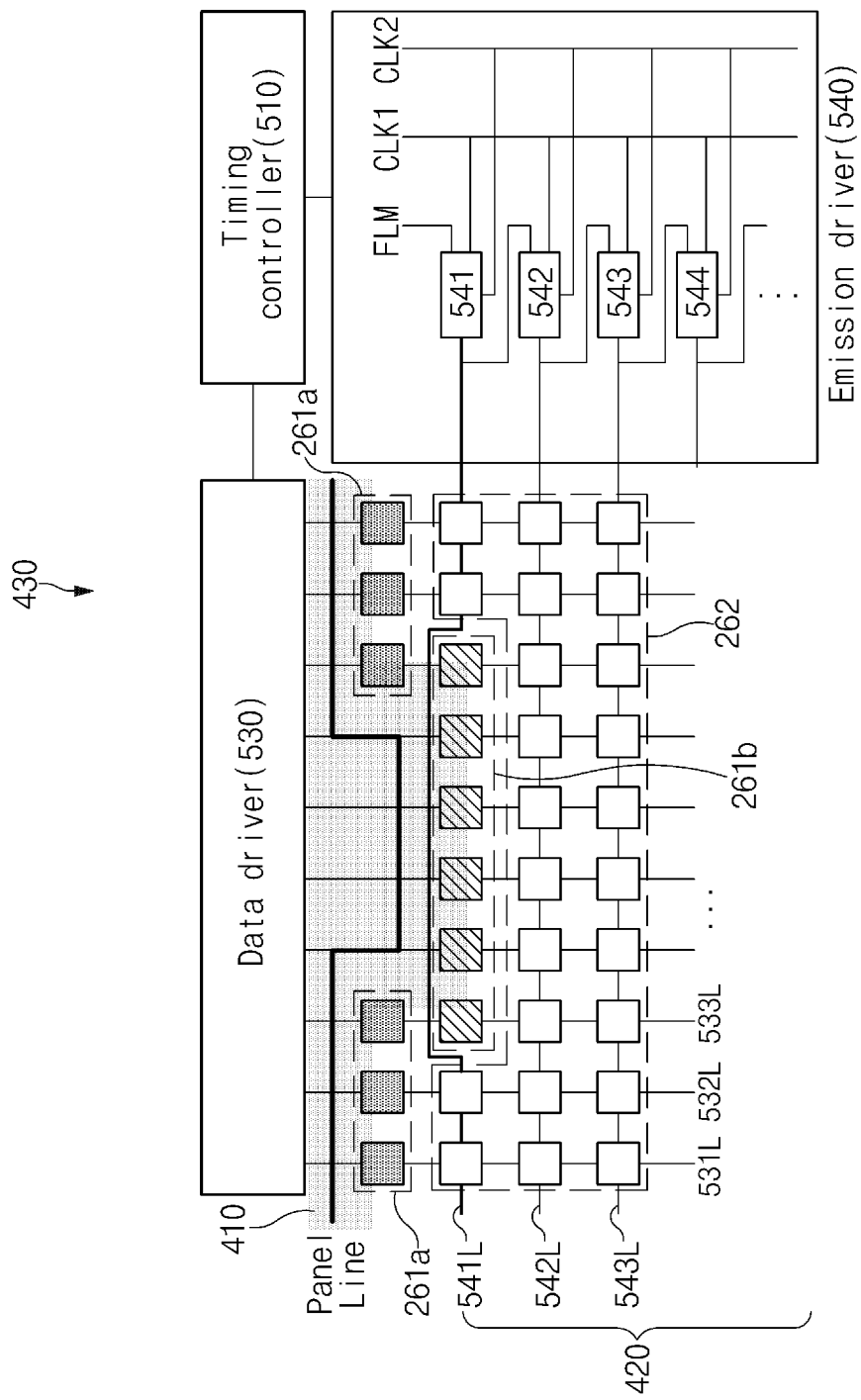
FIG. 5B is an enlarged view of an area of an electronic device according to another embodiment.

FIG. 5A is an enlarged view of an area of an electronic device according to an embodiment. FIG. 5B is an enlarged view of an area of an electronic device according to another embodiment. FIGS. 5A and 5B are enlarged views of an area 430 illustrated in FIG. 4.

Referring to FIGS. 5A and 5B, the electronic device 400 may include a timing controller 510, a gate driver 520, a data driver 530, and an emission driver 540.

The timing controller 510 may transmit various signals to the gate driver 520, the data driver 530 and the emission driver 540 to control the gate driver 520, the data driver 530 and the emission driver 540. The gate driver 520 may transmit a gate signal to screen pixels to turn on a transistor included in each screen pixel. The data driver 530 may transmit a data signal to charge a capacitive element included in each screen pixel. The emission driver 540 may transmit an emission signal to the screen pixels to turn on a driving transistor included in each screen pixel, thereby allowing the screen pixels to emit light.

The gate driver 520 may include a plurality of stages 521 to 524. Each of the stages 521 to 524 may be coupled to at least some of the second group pixels 262 through gate lines 521L, 522L and 523L. The data driver 530 may be coupled to at least some of the second group pixels 262 through a plurality of data lines 531L, 532L and 533L. The emission driver 540 may include a plurality of stages 541 to 544. Each of the stages 541 to 544 may be connected to at least some of the second group pixels 262 through emission lines 541L, 542L and 543L.

According to an embodiment, some pixels 261a of the first group of screen pixels 261a and 261b (or dummy screen pixels) might not be connected to the gate lines 521L, 522L and 523L and/or the emission lines 541L, 542L and 543L. Since the some screen pixels 261a are not connected to the gate lines 521L, 522L and 523L or the emission lines 541L, 542L and 543L, the screen pixels 261a may not emit light.

The remaining screen pixels 261b of the first group of screen pixels 261a and 261b may not be connected to at least one of the gate lines 521L, 522L and 523L, the data lines 531L, 532L and 533L, and the emission lines 541L, 542L, and 543L. FIG. 5A illustrates the remaining screen pixels 261b that are not connected to the gate line according to an embodiment. For example, in FIG. 5A, the first gate line 521L may be connected to the second group of screen pixels 262 by bypassing the remaining screen pixels 261b. FIG. 5B illustrates an embodiment in which the remaining pixels 261b are not connected to the emission line. For example, in FIG. 5B, the first emission line 541L may be connected to the second group of screen pixels 262 by bypassing the remaining screen pixels 261b. Although not illustrated in FIGS. 5A and 5B, the remaining screen pixels 261b may not be connected to the data lines 531L, 532L and 533L.

According to an embodiment, since the first group of screen pixels 261a and 261b are not connected to at least one of the gate lines 521L, 522L and 523L, the data lines 531L, 532L and 533L, and the emission lines 541L, 542L and 543L, the first group of screen pixels 261a and 261b may not emit light. Specifically, when the bezel 410 is black and contents are not output through the active area 420, the front surface of the electronic device 400 may appear black. Thus, the boundary line 16 might not appear on the front surface of the electronic device 400, and the aesthetics felt through the electronic device 400 may be improved.

Figure 6:
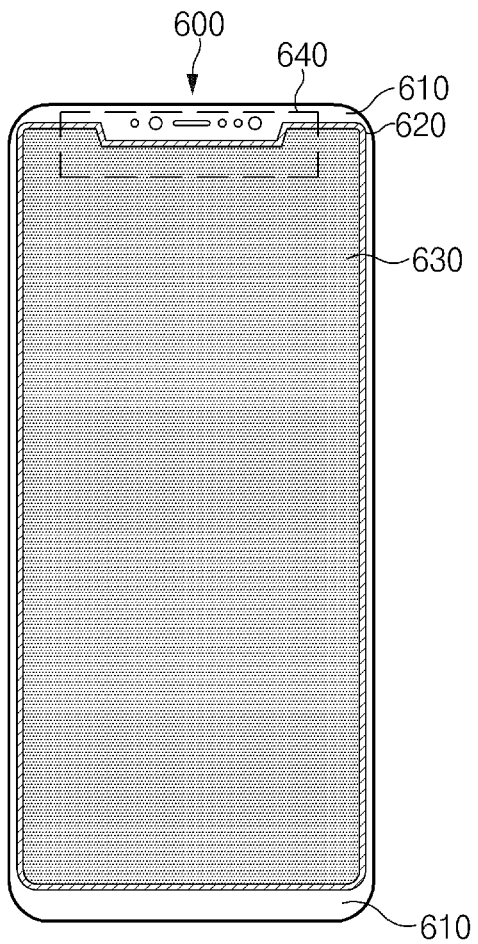
FIG. 6 is a view illustrating a front part of an electronic device according to still another embodiment.

FIG. 6 is a view illustrating a front part of an electronic device according to still another embodiment.

Referring to FIG. 6, an electronic device 600 may include a bezel 610 and an active area. The bezel 610 illustrated in FIG. 6 may be white unlike the embodiments described in FIGS. 1 to 5.

The active area may include first and second areas 620 and 630. The first area 620 may be an area corresponding to the boundary line 16 illustrated in FIG. 4. The second area 630 through which contents such as photographs and moving images are outputted may occupy most of the display panel. Unlike the embodiments illustrated in FIGS. 1 to 5, screen pixels (e.g., the second group pixels 262) that are not dummy screen pixels may be arranged in the first area 620 of the electronic device illustrated in FIG. 6.

According to an embodiment, the electronic device 600 may reduce a color difference between the bezel 610 and the second area 630. For example, when the color of the bezel 610 is white and the color of the second area 630 is black, the electronic device 600 may control the pixels arranged in the first area 620 such that the screen pixels emit light starting from black and progressively lighter shades of gray and then white as the screen pixels approach the bezel 610 from the second area 630. As another embodiment, when the color of the bezel 610 is white and the color of the second area 630 is red, the electronic device 600 may control the pixels arranged in the first area 620 such that the pixels emit light gradually starting from red and progressively lighter shades of pink and then white as the screen pixels approach the bezel 610 from the second area 630.

According to an embodiment, by gradually changing and outputting the color of the first area 620, the electronic device 600 having a front surface of a natural color or color sense may be provided to a user. Therefore, according to certain embodiments, the dummy screen pixels near the active area 254 can start with the color of the active area 254. As the dummy screen pixels approach the bezel 130, the dummy screen pixels can gradually reduce components of the color of the active area 254 and increase components of the color of the bezel 130, until the dummy screen pixels immediately proximate to the bezel 130 are visibly the same color.

The foregoing examples are illustrative:

| Screen Color | Intermediary Color | Bezel Color |
| --- | --- | --- |
| Yellow | Yellow-Green- Blue | Blue |
| Red | Red-Purple-Blue | Blue |
| Yellow | Yellow-Orange-Red | Red |

Figure 7:
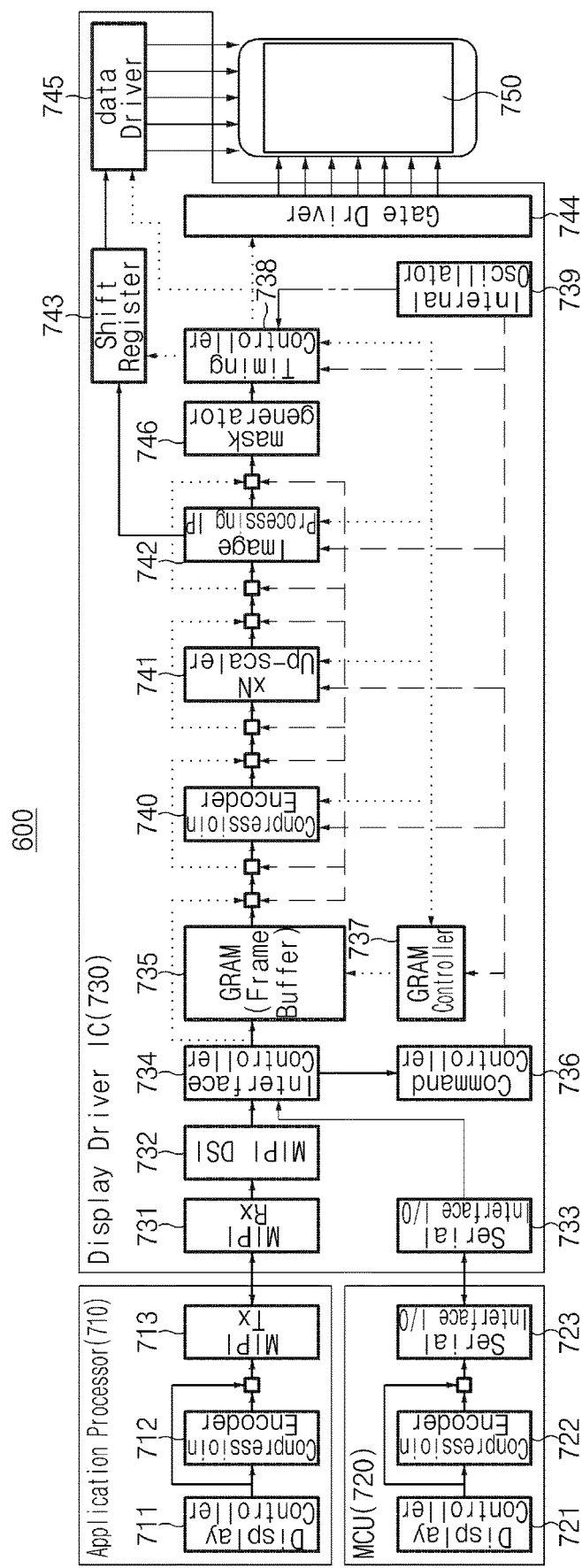
FIG. 7 is a block diagram of an electronic device according to still another embodiment.

FIG. 7 is a block diagram of an electronic device according to still another embodiment. FIG. 7 is a block diagram illustrating components included in the electronic device 600 illustrated in FIG. 6.

Referring to FIG. 7, an electronic device 600 may include an application processor (AP) 710, a micro control unit (MPU) 720, a display driver IC (DDI) 730, and a display panel 750.

The AP 710 may include a display controller 711, a compression encoder 712, and a mobile industry processor interface (MIPI) transmission module 713. The display controller 711 may generate image data. The compression encoder 712 may encode the image data in a specified manner. According to an embodiment, the process of encoding the image data may be omitted or bypassed. The MIPI transmission module 713 may transmit the encoded image data and/or unencoded image data to the DDI 730.

The micro control unit 720 may include a display controller 721, a compression encoder 722, and a serial interface transmission module 723. The display controller 721 may generate control information for selecting or controlling image data to be output to the display panel 750. The compression encoder 722 may encode the generated control information. According to an embodiment, the process of encoding the control information may be omitted or bypassed. The serial interface transmission module 723 may transmit the encoded control information and/or the unencoded control information to the DDI 730. Unlike FIG. 7, the micro control unit 720 may be included in the application processor 710.

The DDI 730 may include a MIPI receiving module 731, a MIPI display serial interface 732, a serial interface receiving module 733, an interface controller 734, a graphic RAM (GRAM) 735, a command controller 736, a GRAM controller 737, a timing controller 738, an internal oscillator 739, a compression encoder 740, an up-scaler 741, an image processing IP 742, a mask generator 746, a shift register 743, a gate driver 744, and a data driver 745.

The MIPI receiving module 731 may receive the encoded image data and/or the unencoded image data from the MIPI transmission module 713.

The MIPI display serial interface 732 may set the address at which the image data received by the MIPI receiving module 731 is stored in the GRAM 735.

The serial interface receiving module 733 may receive the encoded control information and/or the unencoded control information from the serial interface transmission module 723.

The interface controller 734 may control the GRAM 735 such that the GRAM 735 stores image data. According to an embodiment, the interface controller 734 may control the GRAM 735 to store image data at the address set by the MIPI display serial interface 732. In addition, the interface controller 734 may transmit the control information to the command controller 736.

The GRAM 735 may store the encoded image data and/or the unencoded image data. In this case, the GRAM 735 may store the image data at the address set by the MIPI display serial interface 732.

The command controller 736 may control the GRAM controller 737, the timing controller 738, and the internal oscillator 739 based on the control information. For example, the command controller 736 may control the GRAM controller 737 such that the GRAM controller 737 selects at least some of the image data stored in the GRAM 735. In addition, the command controller 736 may allow the timing controller 738 to control the driving timing of the gate driver 744 and the data driver 745. A signal for controlling the timing controller 738 may be directly transmitted to the timing controller 738 or may be transmitted to the timing controller 738 through the internal oscillator 739.

The GRAM controller 737 may select at least some of the image data stored in the GRAM 735. For example, the GRAM controller 737 may select at least some of the image data based on the address of the image data and/or the size of the image data.

The compression encoder 740 may encode the selected image data. The size of the selected image data through the encoding process may be reduced.

The up-scaler 741 may expand the image data at a specified magnification.

The image processing IP 742 may improve the image quality of the image data. Although not illustrated, the image processing IP 742 may include a pixel data processing circuit, a pre-processing circuit, a gating circuit, and the like.

The mask generator 746 may calculate and apply a color transformation value for the first area 630 which transforms the color of the screen pixels in the second area 620 starting from the color at the edge of the first area 630 to the color of the bezel 610. For example, the mask generator 746 may reduce the color transformation value for the first area 630 as the distance from the bezel 610 decreases, and may increase the color transformation value as the distance from the bezel 130 increases. On the contrary, the mask generator 746 may reduce the color deformation value for the first area 630 as the distance from the second area 620 decreases and may increase the color transformation value as the distance from the second area 620 increases. Thus, the mask generator 746 may allow an area of the first area 620 near the bezel 610 to output a color similar to the color of the bezel 610 and may allow an area of the first area 620 near the second area 630 to output a color similar to the color of the second area 630.

According to an embodiment, the mask generator 746 may include an arithmetic unit capable of calculating the color transformation value. The mask generator 746 may calculate the color transformation value through the arithmetic unit.

The shift register 743 may change the position at which the image data is output on the display.

The gate driver 744 and the data driver 745 may correspond to the gate driver 520 and the data driver 530 illustrated in FIG. 5A.

The display panel 750 may output image data.

In the present disclosure, the details described in FIGS. 6 and 7 may be equally applied to the components having the same reference numerals as those of the electronic device 600 illustrated in FIGS. 6 and 7.

Figure 8:
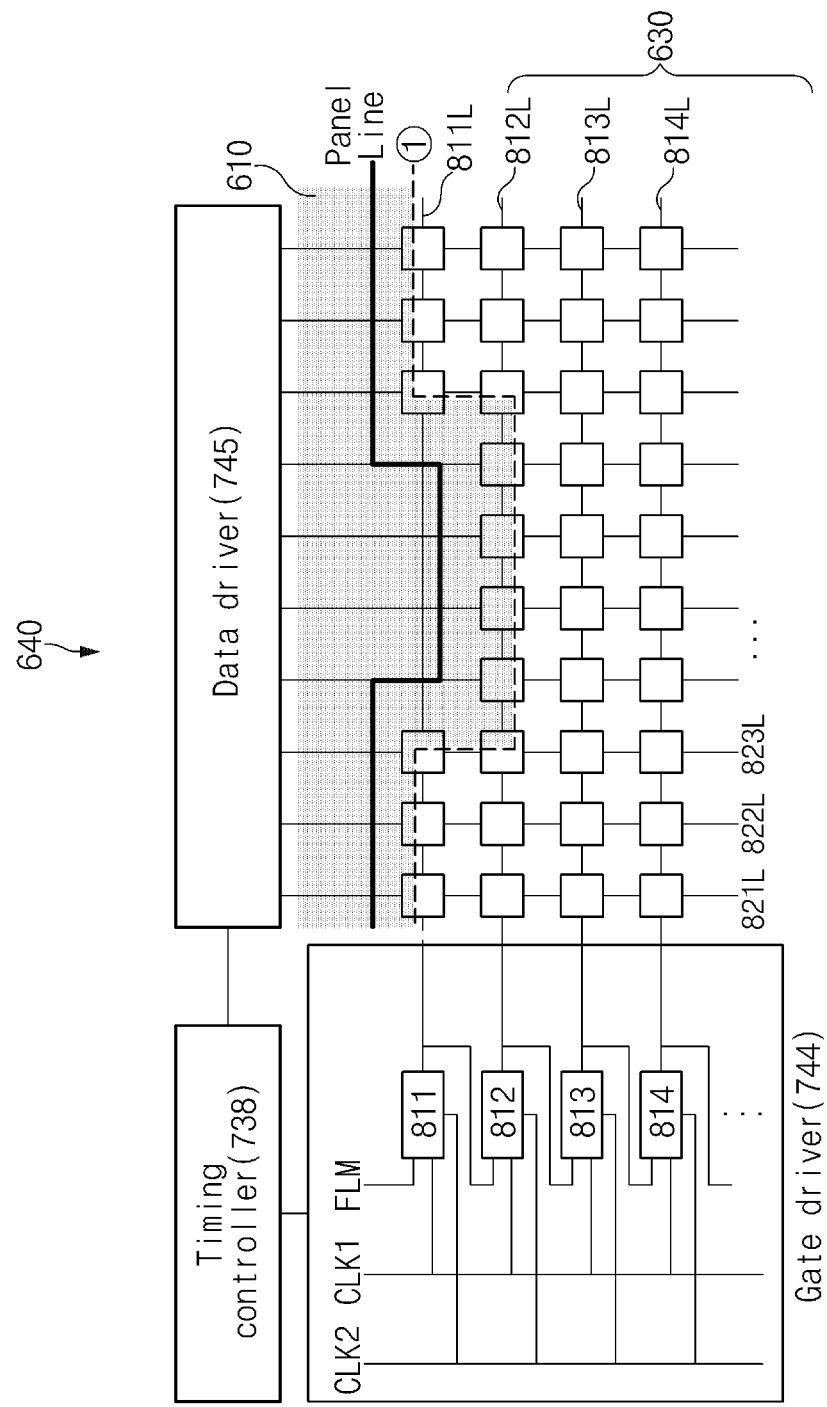
FIG. 8 is an enlarged view of an area of an electronic device according to still another embodiment.

FIG. 8 is an enlarged view of an area of an electronic device according to still another embodiment. FIG. 8 is an enlarged view of an area 640 illustrated in FIG. 6. In FIG. 8, screen pixels arranged on a first line ① may correspond to screen pixels arranged in the first area 620 of FIG. 6. Except for the screen pixels arranged on the first line ①, the remaining screen pixels may correspond to the screen pixels arranged in the second area 630.

Referring to FIG. 8, the gate driver 744 may include a plurality of stages 811 to 814. Each of the stages 811 to 814 may be connected to the screen pixels through gate lines 811L to 814L. Meanwhile, the data driver 745 may be connected to the screen pixels through data lines 821L to 824L.

According to an embodiment, the color of the bezel 610 and the color of the second area 630 may be the same. In this case, the electronic device 600 (or the mask generator 746 illustrated in FIG. 7) may control the screen pixels such that the screen pixels arranged on the first line ① output the same color as the colors of the bezel 610 and the second area 630. For example, when the color of the bezel 610 is white and white is output through the second area 630, the electronic device 600 may control the screen pixels arranged on the first line ① such that the screen pixels arranged on the first line ① emit white light.

According to another embodiment, the color of the bezel 610 and the color of the second area 630 may be different from each other. In this case, the electronic device 600 (or the mask generator 746 illustrated in FIG. 7) may blend the colors of the bezel 610 and the second area 630 and may output the blended color through the screen pixels arranged on the first line ①.

Although one pixel line arranged in the first area 620 is illustrated in FIG. 8 for the purpose of simplicity of description, a plurality of pixel lines may be arranged in the first area 620. In this case, the electronic device 600 (or the mask generator 746 illustrated in FIG. 7) may control to output a color more similar to the color of the second area 630 as the pixel line is closer to the second area 630. The electronic device 600 (or the mask generator 746 illustrated in FIG. 7) may control to output a color more similar to the color of the bezel 610 as the pixel line is closer to the bezel 610. Accordingly, the electronic device 600 having a front surface of a natural color or color sense may be provided to a user.

According to an embodiment, when the data driver 745 transmits a data signal through the data lines 821L to 823L, the timing controller 738 may synchronize data signal transmission timing with gate signal transmission timing.

TABLE 1

| CLK1 | CLK2 | FLM | Gate signal |
|------|------|-----|-------------|
| 1    | 0    | 0   | 0           |
| 1    | 0    | 1   | 1           |
| X    | 1    | X   | 0           |

Referring to Table 1, when the data signal is transmitted, the timing controller 738 may change levels of a first clock signal CLK1 and a light emission control start signal FLM into high levels. When the first clock signal CLK1 and the light emission control start signal FLM are at a high level, the gate signal output from a stage may also be at a high level, so that the transistor connected to the corresponding gate line is turned on. When the transistor is turned on, the data signal may be transferred to a capacitive element (e.g., a capacitor) included in the pixel through the turned-on transistor, so that the capacitive element is charged. When a current flows through an organic light emitting diode by the charged voltage, the pixel may emit light.

Figure 9A:
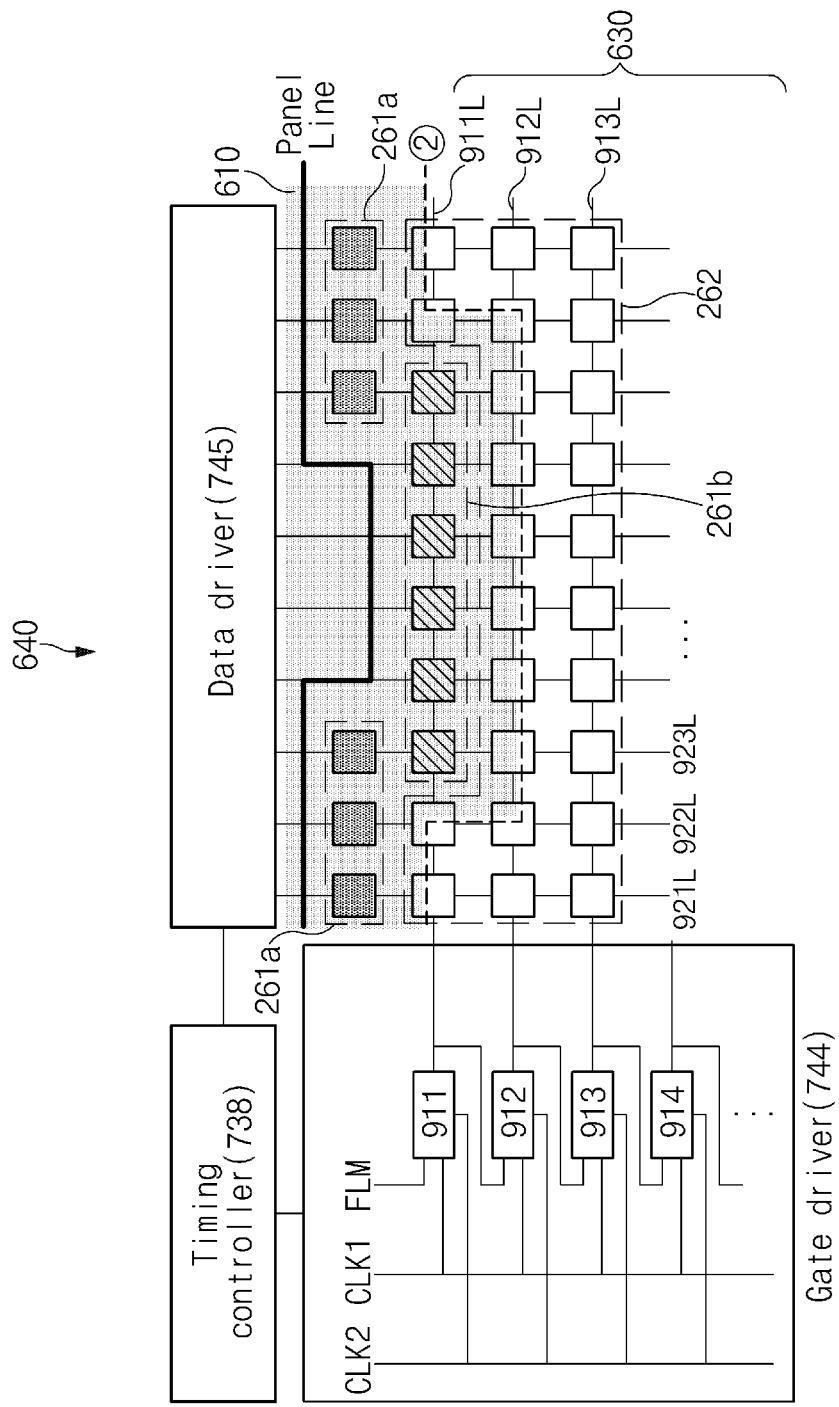
FIG. 9A is an enlarged view of an area of an electronic device according to still another embodiment.

FIG. 9A is an enlarged view of an area of an electronic device according to still another embodiment. FIG. 9A is an enlarged view of an area 640 illustrated in FIG. 6. In FIG. 9A, screen pixels arranged on a second line ② may correspond to screen pixels arranged in the first area 620 of FIG. 6. Except for the screen pixels arranged on the second line ②, the remaining screen pixels may correspond to the screen pixels arranged in the second area 630 of FIG. 6.

Referring to FIG. 9A, the electronic device 600 may include the first group of screen pixels 261a and 261b and the second group of screen pixels 262. The gate driver 744 may include a plurality of stages 911 to 914. Each of the stages 911 to 914 may be connected to at least some of the second group of screen pixels 262 through gate lines 911L to 913L. Meanwhile, the data driver 745 may be connected to at least some of the second group of screen pixels 262 through data lines 921L to 923L.

Some screen pixels 261a of the first group of screen pixels 261a and 261b (or dummy screen pixels) may not be connected to the gate lines 911L to 913L and/or emission lines. Since the some screen pixels 261a are not connected to the gate lines 911L to 913L and/or the emission lines, the some screen pixels 261a may not emit light.

The remaining screen pixels 261b of the first group of screen pixels 261a and 261b may be connected to the gate lines 911L to 913L, data lines 921L to 923L, and the emission lines. The electronic device 600 (or the mask generator 746 illustrated in FIG. 7) may control the remaining screen pixels 261b not to emit light. Thus, all the first group of screen pixels 261a and 261b may not emit light.

According to an embodiment, the color of the first group of screen pixels 261a and 261b may be different from that of the second area 630. In this case, the electronic device 600 (or the mask generator 746 illustrated in FIG. 7) may blend the colors of the first group of screen pixels 261a and 261b and the second area 630 and may output the blended color through the screen pixels arranged on the second line ②. For example, since the first group of screen pixels 261a and 261b do not emit light, the color output through the first group of screen pixels 261a and 261b may be black. Thus, the electronic device 600 may blend the color of the second area 630 and black, and output the blended color through the of screen pixels arranged in the second line ②.

The second line ② illustrated in FIG. 9A is an example, and the second line ② may be different from that illustrated in FIG. 9A. For example, when the bezel 610 and the display panel 750 are combined with each other at a specified tilt, the second line ② may also be inclined in proportion to the tilt. In this case, the electronic device 600 (or the mask generator 746 illustrated in FIG. 7) may blend the color of the first group of screen pixels 261a and 261b with the color of the second area 630, and output the blended color through the screen pixels arranged in the second line ②.

Figure 9B:
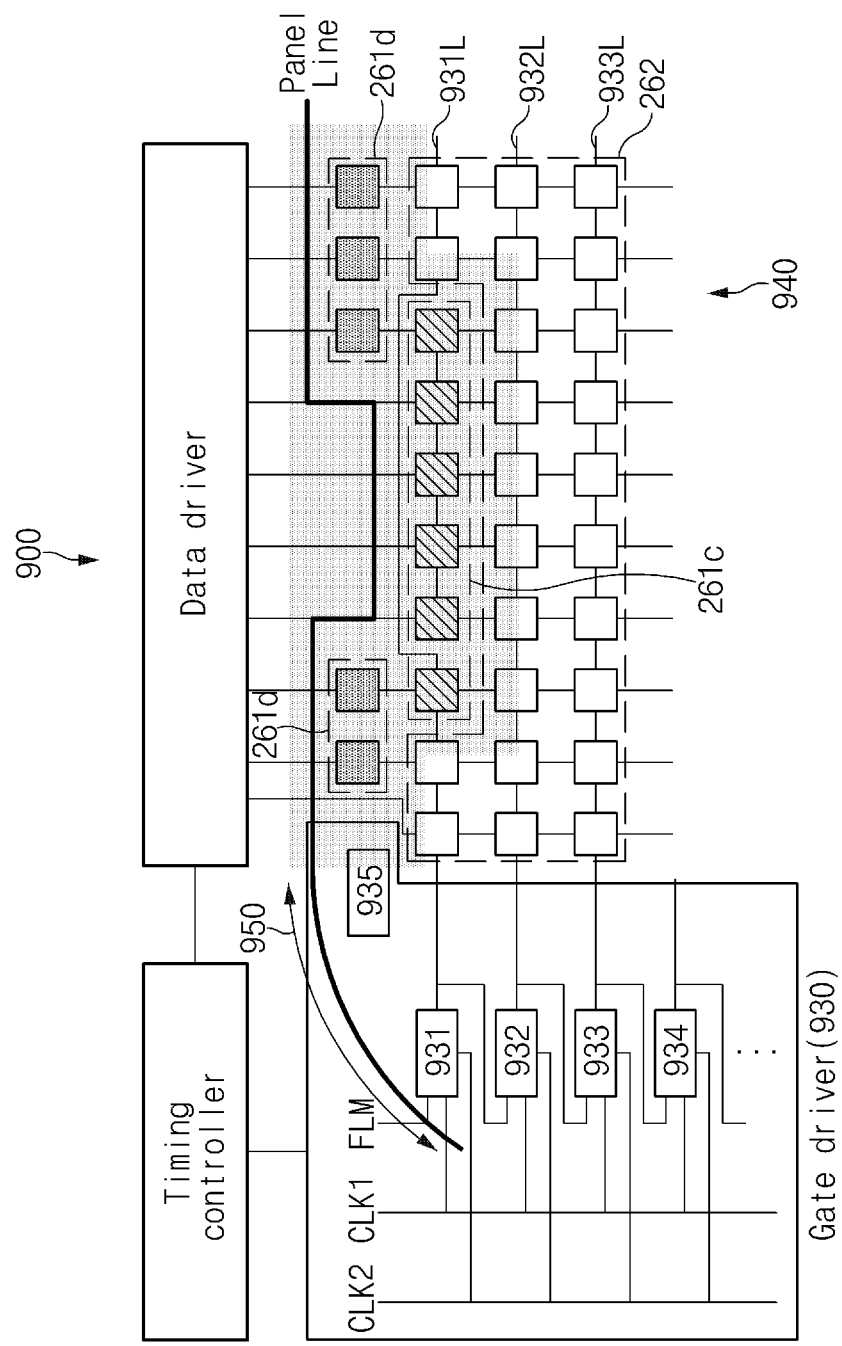
FIG. 9B is an enlarged view of an area of an electronic device according to still another embodiment.

FIG. 9B is an enlarged view of an area of an electronic device according to still another embodiment. FIG. 9B illustrates an electronic device 900 that includes a part of a display panel 940 having a curved surface 950.

Referring to FIG. 9B, a gate driver 930 may include a plurality of stages 931 to 934. The stages 931 to 934 may not be connected to first group of screen pixels 261c and 261d, but may be connected to the second group pixels 262. For example, the first stage 931 may be arranged on a line on which some screen pixels 261c of the first group of screen pixels 261c and 261d are arranged. In this case, since the first gate line 931L is connected to the second group of screen pixels 262 by bypassing the some screen pixels 261c, the first stage 931 may not be connected to the first group of screen pixels 261c and 261d.

In addition, the remaining stages 932 to 934 except for the first stage 931 may be electrically connected to the second group of screen pixels 262. For example, the second stage 932 may be electrically coupled to the screen pixels arranged on the second gate line 932L, and the third stage 933 may be electrically coupled to the screen pixels arranged on the third gate line 933L among the second group screen pixels 262.

According to an embodiment, the electronic device 900 may not include the screen pixels arranged on the curved surface 950 of the first group screen pixels 261c and 261d. In addition, the gate driver 930 may further include an additional stage 935 on the line where the remaining screen pixels 261d of the first group screen pixels 261c and 261d are arranged. The additional stage 935 may not be electrically connected to the remaining screen pixels 261d. For example, the electronic device 900 may not include a line connecting the additional stage 935 and the remaining screen pixels 261d. Since the additional stage 935 and the remaining screen pixels 261d are not electrically connected to each other, the remaining screen pixels 261d may not emit light.

An electronic device according to an embodiment may include a cover glass, a back cover facing the cover glass, a housing surrounding a space between the cover glass and the back cover, a bezel surrounding an edge of the cover glass, a display panel including a first area that is exposed through an area of the cover glass not overlapping the bezel and a second area that surrounds the first area and is arranged below the bezel, first group pixels arranged along an edge of the first area, second group pixels arranged in an area of the first area except for an area, in which the first group pixels are arranged, of the first area, a display driver integrated circuit electrically connected to the second group pixels, and a processor controlling, through the display driver integrated circuit, whether to allow the second group pixels to emit light, where the first group pixels are not electrically connected to the display driver integrated circuit, and the second area includes a gap for compensating a tilt between the cover glass and the display panel when the cover glass is coupled to the display panel.

The electronic device may further include a plurality of drivers electrically connecting the display driver integrated circuit to the second group pixels, where the processor controls whether the second group pixels emit light through the plurality of drivers.

The electronic device may further include a first type driver arranged between the display driver integrated circuit and the first group pixels, and second type drivers electrically connecting each of the second group pixels to the display driver integrated circuit, where the first type driver is not electrically connected to the first group pixels.

The electronic device may not include a line electrically connecting the first type driver and the first group pixels.

The electronic device may further include a shift register electrically connected to the first type driver and the second type drivers, respectively, where the processor transmits a signal for allowing the pixels to emit light to the shift register, and the shift register transmits the signal to the second type drivers.

A plurality of lines, which electrically connect the display driver integrated circuit and the second group pixels, may be arranged in the gap.

The processor may output contents through the second group pixels, and the first group pixels may not emit light.

The electronic device may further include a receiver and a camera module exposed through the bezel, where at least a part of the first area has a shape surrounding the receiver and the camera module.

The first area may include a first edge having a first length, a second edge having the first length and parallel to the first edge, a third edge connecting one end of the first edge and one end of the second edge, and a fourth edge connecting an opposite end of the first edge and an opposite end of the second edge, where the first group pixels are arranged along the first to fourth edges.

At least some of the first group pixels may be arranged in the second area.

An electronic device according to another embodiment may include a cover glass, a back cover facing the cover glass, a housing surrounding a space between the cover glass and the back cover, an upper end bezel arranged on one end of the cover glass and having a specified shape, a lower end bezel arranged on an opposite end of the cover glass, a display panel exposed through the cover glass and including a first area corresponding to the specified shape and a second area between the first area and the lower end bezel, first group pixels arranged in the first area, second group pixels arranged in the second area, and a display driver integrated circuit electrically connected to the first group pixels and the second group pixels, wherein the display driver integrated circuit transmits a disenable signal to the first group pixels to turn off the first group pixels.

A gap, which compensates a tilt between the cover glass and the display panel when the cover glass is coupled to the display panel, may be arranged between the upper end bezel and the display panel.

The display driver integrated circuit may transmit an enable signal to the second group pixels to turn on the second group pixels.

The electronic device may further include a receiver and a camera module exposed through the upper end bezel, where the specified shape surrounds at least a part of the receiver and the camera module.

The electronic device may further include a processor electrically connected to the display driver integrated circuit, where the processor turns off the first group pixels through the display driver integrated circuit.

An electronic device according to still another embodiment may include a display panel including a display area including a plurality of pixels, a non-display area in which a plurality of lines connected to the plurality of pixels are arranged, and a peripheral area in which one or more pixels are arranged between the display area and the non-display area, and a display driver integrated circuit that drives the display panel, where the display driver integrated circuit is configured to display contents in the display area, and not to display the peripheral area while the contents are displayed.

The one or more pixels arranged in the peripheral area may not be electrically connected to the display driver integrated circuit.

The first area may include a first edge having a first length, a second edge having the first length and parallel to the first edge, a third edge connecting one end of the first edge and one end of the second edge, and a fourth edge connecting an opposite end of the first edge and an opposite end of the second edge, where the peripheral area is connected to the first edge.

The electronic device may further include a plurality of lines arranged between the first and second edges and each having a specified separation distance, where the plurality of lines are electrically connected to the plurality of pixels arranged in the display area.

The display driver integrated circuit may transmit a signal for turning on the one or more pixels arranged in the peripheral area, and the electronic device may further include a shift register that transmits the signal to a line closest to the first edge.

Figure 10:
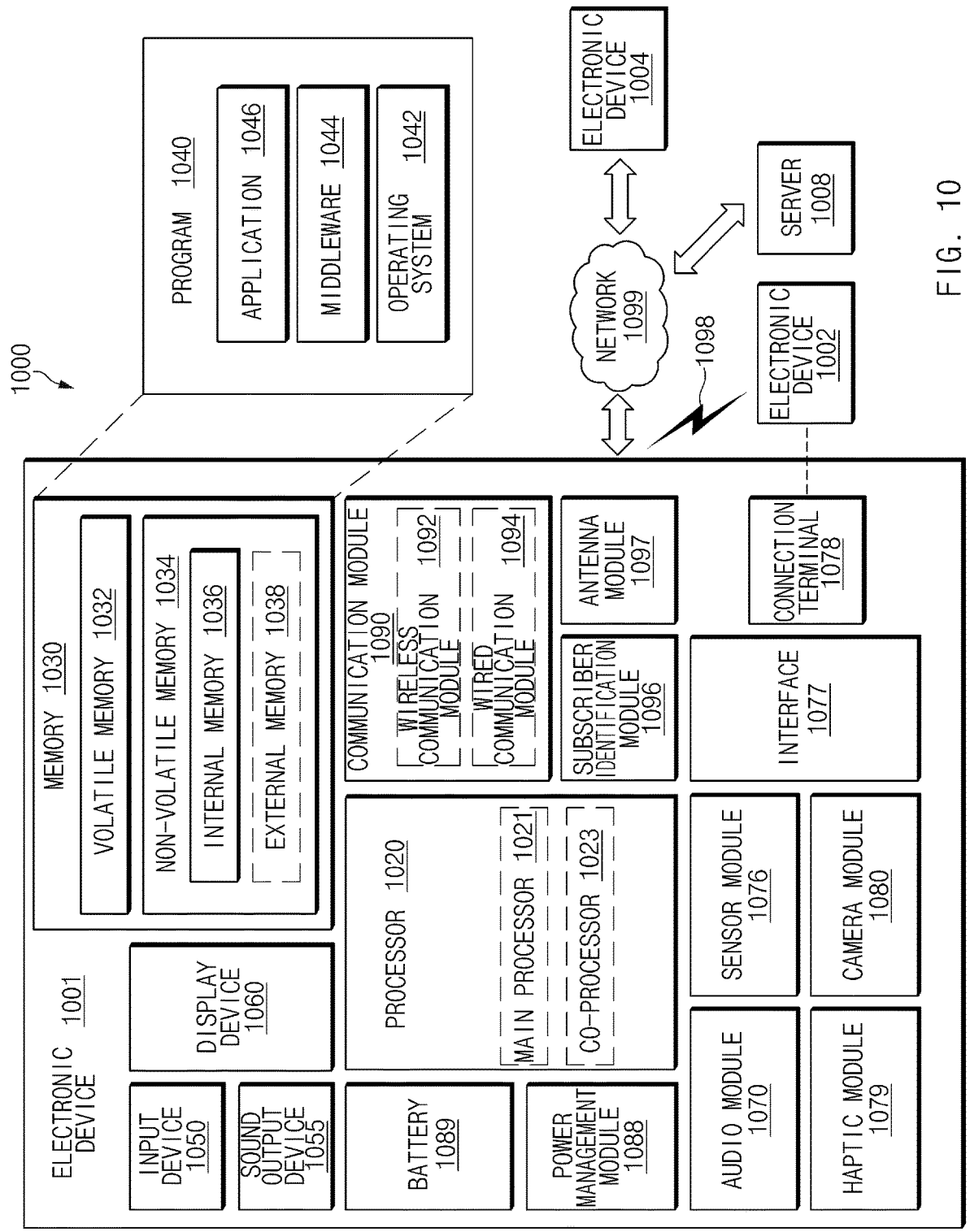
FIG. 10 is a block diagram of an electronic device in a network environment according to various embodiments.

FIG. 10 is a block diagram of an electronic device in a network environment according to various embodiments.

Referring to FIG. 10, an electronic device 1001 may communicate with an electronic device 1002 through a first network 1098 (e.g., a short-range wireless communication) or may communicate with an electronic device 1004 or a server 1008 through a second network 1099 (e.g., a long-distance wireless communication) in a network environment 1000. According to an embodiment, the electronic device 1001 may communicate with the electronic device 1004 through the server 1008. According to an embodiment, the electronic device 1001 may include a processor 1020, a memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module 1096, and an antenna module 1097. According to some embodiments, at least one (e.g., the display device 1060 or the camera module 1080) among components of the electronic device 1001 may be omitted or other components may be added to the electronic device 1001. According to some embodiments, some components may be integrated and implemented as in the case of the sensor module 1076 (e.g., a fingerprint sensor, an iris sensor, or an illuminance sensor) embedded in the display device 1060 (e.g., a display).

The processor 1020 may operate, for example, software (e.g., a program 1040) to control at least one of other components (e.g., a hardware or software component) of the electronic device 1001 connected to the processor 1020 and may process and compute a variety of data. The processor 1020 may load a command set or data, which is received from other components (e.g., the sensor module 1076 or the communication module 1090), into a volatile memory 1032, may process the loaded command or data, and may store result data into a nonvolatile memory 1034. According to an embodiment, the processor 1020 may include a main processor 1021 (e.g., a central processing unit or an application processor) and an auxiliary processor 1023 (e.g., a graphic processing device, an image signal processor, a sensor hub processor, or a communication processor), which operates independently from the main processor 1021, additionally or alternatively uses less power than the main processor 1021, or is specified to a designated function. In this case, the auxiliary processor 1023 may operate separately from the main processor 1021 or embedded.

In this case, the auxiliary processor 1023 may control, for example, at least some of functions or states associated with at least one component (e.g., the display device 1060, the sensor module 1076, or the communication module 1090) among the components of the electronic device 1001 instead of the main processor 1021 while the main processor 1021 is in an inactive (e.g., sleep) state or together with the main processor 1021 while the main processor 1021 is in an active (e.g., an application execution) state. According to an embodiment, the auxiliary processor 1023 (e.g., the image signal processor or the communication processor) may be implemented as a part of another component (e.g., the camera module 1080 or the communication module 1090) that is functionally related to the auxiliary processor 1023. The memory 1030 may store a variety of data used by at least one component (e.g., the processor 1020 or the sensor module 1076) of the electronic device 1001, for example, software (e.g., the program 1040) and input data or output data with respect to commands associated with the software. The memory 1030 may include the volatile memory 1032 or the nonvolatile memory 1034.

The program 1040 may be stored in the memory 1030 as software and may include, for example, an operating system 1042, a middleware 1044, or an application 1046.

The input device 1050 may be a device for receiving a command or data, which is used for a component (e.g., the processor 1020) of the electronic device 1001, from an outside (e.g., a user) of the electronic device 1001 and may include, for example, a microphone, a mouse, or a keyboard.

The sound output device 1055 may be a device for outputting a sound signal to the outside of the electronic device 1001 and may include, for example, a speaker used for general purposes, such as multimedia play or recordings play, and a receiver used only for receiving calls. According to an embodiment, the receiver and the speaker may be either integrally or separately implemented.

The display device 1060 may be a device for visually presenting information to the user of the electronic device 1001 and may include, for example, a display, a hologram device, or a projector and a control circuit for controlling a corresponding device. According to an embodiment, the display device 1060 may include a touch circuitry or a pressure sensor for measuring an intensity of pressure on the touch.

The audio module 1070 may convert a sound and an electrical signal in dual directions. According to an embodiment, the audio module 1070 may obtain the sound through the input device 1050 or may output the sound through an external electronic device (e.g., the electronic device 1002 (e.g., a speaker or a headphone)) wired or wirelessly connected to the sound output device 1055 or the electronic device 1001.

The sensor module 1076 may generate an electrical signal or a data value corresponding to an operating state (e.g., power or temperature) inside or an environmental state outside the electronic device 1001. The sensor module 1076 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 1077 may support a designated protocol wired or wirelessly connected to the external electronic device (e.g., the electronic device 1002). According to an embodiment, the interface 1077 may include, for example, an HDMI (high-definition multimedia interface), a USB (universal serial bus) interface, an SD card interface, or an audio interface.

A connecting terminal 1078 may include a connector that physically connects the electronic device 1001 to the external electronic device (e.g., the electronic device 1002), for example, an HDMI connector, a USB connector, an SD card connector, or an audio connector (e.g., a headphone connector).

The haptic module 1079 may convert an electrical signal to a mechanical stimulation (e.g., vibration or movement) or an electrical stimulation perceived by the user through tactile or kinesthetic sensations. The haptic module 1079 may include, for example, a motor, a piezoelectric element, or an electric stimulator.

The camera module 1080 may shoot a still image or a video image. According to an embodiment, the camera module 1080 may include, for example, at least one lens, an image sensor, an image signal processor, or a flash.

The power management module 1088 may be a module for managing power supplied to the electronic device 1001 and may serve as at least a part of a power management integrated circuit (PMIC).

The battery 1089 may be a device for supplying power to at least one component of the electronic device 1001 and may include, for example, a non-rechargeable (primary) battery, a rechargeable (secondary) battery, or a fuel cell.

The communication module 1090 may establish a wired or wireless communication channel between the electronic device 1001 and the external electronic device (e.g., the electronic device 1002, the electronic device 1004, or the server 1008) and support communication execution through the established communication channel. The communication module 1090 may include at least one communication processor operating independently from the processor 1020 (e.g., the application processor) and supporting the wired communication or the wireless communication. According to an embodiment, the communication module 1090 may include a wireless communication module 1092 (e.g., a cellular communication module, a short-range wireless communication module, or a GNSS (global navigation satellite system) communication module) or a wired communication module 1094 (e.g., an LAN (local area network) communication module or a power line communication module) and may communicate with the external electronic device using a corresponding communication module among them through the first network 1098 (e.g., the short-range communication network such as a Bluetooth, a WiFi direct, or an IrDA (infrared data association)) or the second network 1099 (e.g., the long-distance wireless communication network such as a cellular network, an internet, or a computer network (e.g., LAN or WAN)). The above-mentioned various communication modules 1090 may be implemented into one chip or into separate chips, respectively.

According to an embodiment, the wireless communication module 1092 may identify and authenticate the electronic device 1001 using user information stored in the subscriber identification module 1096 in the communication network.

The antenna module 1097 may include one or more antennas to transmit or receive the signal or power to or from an external source. According to an embodiment, the communication module 1090 (e.g., the wireless communication module 1092) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 1001 and the external electronic device 1004 through the server 1008 connected to the second network 1099. Each of the electronic devices 1002 and 1004 may be the same or different types as or from the electronic device 1001. According to an embodiment, all or some of the operations performed by the electronic device 1001 may be performed by another electronic device or a plurality of external electronic devices. When the electronic device 1001 performs some functions or services automatically or by request, the electronic device 1001 may request the external electronic device to perform at least some of the functions related to the functions or services, in addition to or instead of performing the functions or services by itself. The external electronic device receiving the request may carry out the requested function or the additional function and transmit the result to the electronic device 1001. The electronic device 1001 may provide the requested functions or services based on the received result as is or after additionally processing the received result. To this end, for example, a cloud computing, distributed computing, or client-server computing technology may be used.

Figure 11:
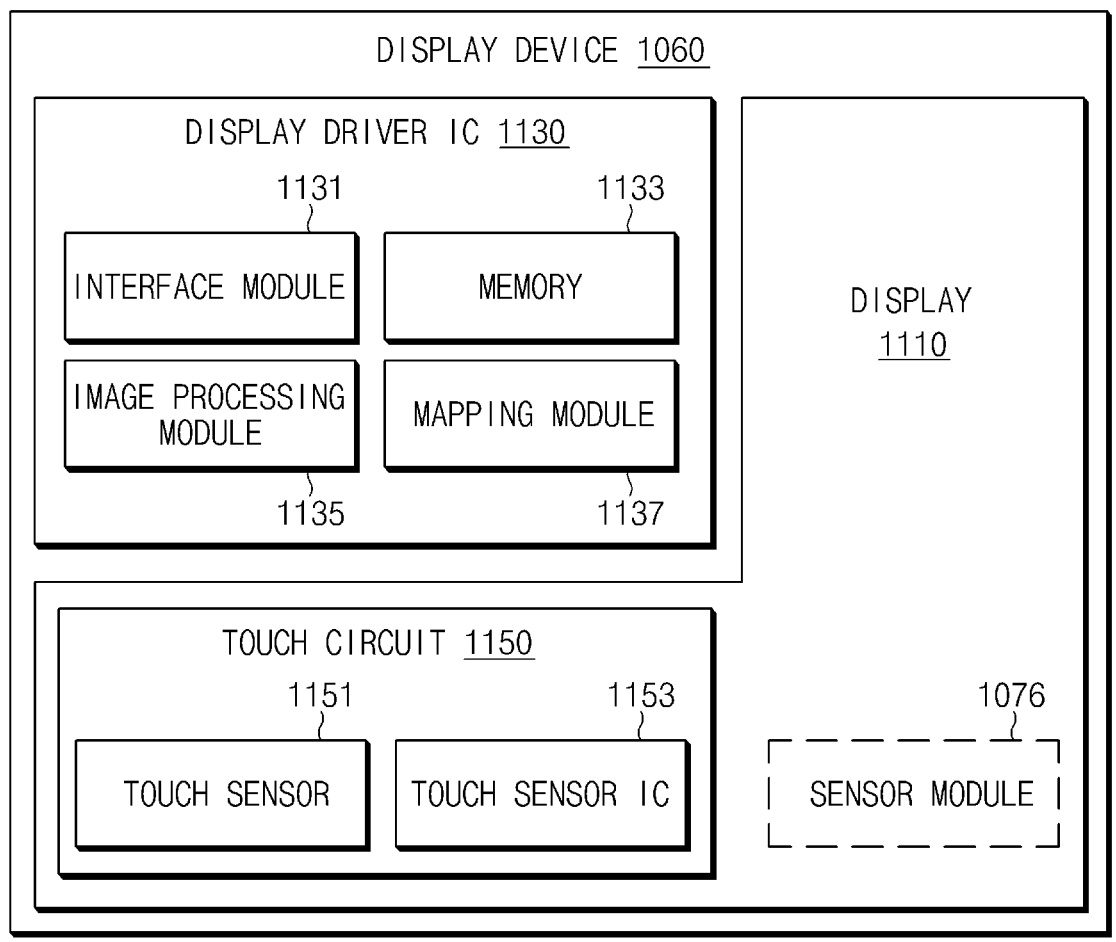
FIG. 11 is a block diagram of a display device according to various embodiments.

FIG. 11 is a block diagram of a display device according to various embodiments.

Referring to FIG. 11, the display device 1060 may include a display 1110 and a display driver IC (DDI) 1130 for controlling the display 1110. The DDI 1130 may include an interface module 1131, a memory 1133 (e.g., a buffer memory), an image processing module 1135, or a mapping module 1137. For example, the DDI 1130 may receive image information including image data or an image control signal corresponding to a command for controlling the image data from a processor 1020 (e.g., a main processor 1021 or an application processor) or an auxiliary processor 1023, which is operated independently of the main processor 1021, through the interface module 1131. The DDI 1130 may communicate with a touch circuit 1150, the sensor module 1076, or the like through the interface module 1131. In addition, the DDI 1130 may store at least a part of the received image information in the memory 1133, for example, in units of frames. For example, the image processing module 1135 may perform preprocessing or post-processing (e.g., adjustment of resolution, brightness, or size) on at least a part of the image data based at least partially on characteristics of the image data or the display 1110. The mapping module 1137 may convert the image data preprocessed or post-processed through the image processing module 1135 into a voltage value or a current value capable of driving the pixels, based at least partially on attributes of the pixels of the display 1110 (e.g., an array of pixels (RGB stripe or pentile) or a size of each of subpixels). For example, at least some pixels of the display 1110 may be driven based on the voltage or current value, such that visual information (e.g., a text, an image, or an icon) corresponding to the image data is displayed on the display 1110.

According to an embodiment, the display device 1060 may further include the touch circuit 1150. The touch circuit 1150 may include a touch sensor 1151 and a touch sensor IC 1153 for controlling the touch sensor 1151. The touch sensor IC 1153 may controls the touch sensor 1151 to measure, for example, a change in a signal (e.g., a voltage, a light amount, a resistance, or a charge amount) at a specific position of the display 1110 to sense a touch input or a hovering input, and may provide information (e.g., a location, an area, a pressure or a time) about the sensed touch input or hovering input to the processor 1020. According to an embodiment, at least a part (e.g., the touch sensor IC 1153) of the touch circuit 1150 may be included as a part of the display driver IC 1130 or the display 1110, or as a part of another component (e.g., the auxiliary processor 1023) arranged outside the display device 1060.

According to an embodiment, the display device 1060 may further include at least one sensor (e.g., a fingerprint sensor, an iris sensor, a pressure sensor or an illuminance sensor) of the sensor module 1076, or a control circuitry thereof. In this case, the at least one sensor or the control circuitry thereof may be embedded in a part (e.g., the display 1110 or the DDI 1130) of the display device 1060 or a part of the touch circuit 1150. For example, when the sensor module 1076 embedded in the display device 1060 includes a biometric sensor (e.g., a fingerprint sensor), the biometric sensor may obtain biometric information associated with a touch input through an area of the display 1110. As another example, when the sensor module 1076 embedded in the display device 1060 includes a pressure sensor, the pressure sensor may obtain information about a pressure corresponding to a touch input through an area or entire area of the display 1110. According to an embodiment, the touch sensor 1151 or the sensor module 1076 may be arranged between pixels of the pixel layer of the display 1110, or above or below the pixel layer.

The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments do not intend to limit technologies disclosed in the present disclosure to the particular forms disclosed herein; rather, the present disclosure should be construed to cover various modifications, equivalents, and/or alternatives of embodiments of the present disclosure. With regard to description of drawings, similar components may be assigned with similar reference numerals. As used herein, singular forms may include plural forms as well unless the context clearly indicates otherwise. In the present disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the present disclosure may be implemented by software (e.g., the program 1040) including an instruction stored in a machine-readable storage media (e.g., an internal memory 1036 or an external memory 1038) readable by a machine (e.g., a computer). The machine may be a device that calls the instruction from the machine-readable storage media and operates depending on the called instruction and may include the electronic device (e.g., the electronic device 1001). When the instruction is executed by the processor (e.g., the processor 1020), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a cover glass;
   a back cover facing the cover glass;
   a housing surrounding a space between the cover glass and the back cover;
   a bezel surrounding an edge of a plane arranged below the cover glass;
   a display panel including a first area that is exposed through an area of the cover glass not overlapping the bezel and a second area that surrounds the first area and is arranged below the bezel, and wherein the first area comprises an inactive area and an active area;
   a first group of screen pixels arranged along an edge of the inactive area;
   a second group of screen pixels arranged in the active area;
   a display driver integrated circuit electrically connected to the second group pixels; and
   a processor controlling, through the display driver integrated circuit, whether to allow the second group pixels to emit light,
   wherein the first group of screen pixels are not electrically connected to the display driver integrated circuit, and
   wherein the second area includes a gap for compensating a tilt between the cover glass and the display panel when the cover glass is coupled to the display panel.

2. The electronic device of claim 1, further comprising:
   a plurality of drivers electrically connecting the display driver integrated circuit to the second group of screen pixels,
   wherein the processor controls whether the second group of screen pixels emit light through the plurality of drivers.

3. The electronic device of claim 1, further comprising:
   a first type driver arranged between the display driver integrated circuit and the first group of screen pixels, and
   second type drivers electrically connecting each of the second group of screen pixels to the display driver integrated circuit
   wherein the first type driver is not electrically connected to the first group of screen pixels.

4. The electronic device of claim 3, wherein a line electrically connecting the first type driver and the first group of screen pixels is not included.

5. The electronic device of claim 3, further comprising:
   a shift register electrically connected to the first type driver and the second type drivers, respectively,
   wherein the processor transmits a signal for allowing the screen pixels to emit light to the shift register, and
   wherein the shift register transmits the signal to the second type drivers.

6. The electronic device of claim 1, wherein a plurality of lines, which electrically connect the display driver integrated circuit and the second group of screen pixels, are arranged in the gap.

7. The electronic device of claim 1, wherein the processor outputs contents through the second group of screen pixels, and
   wherein the first group of screen pixels do not emit light.

8. The electronic device of claim 1, further comprising:
   a receiver and a camera module exposed through the bezel,
   wherein at least a part of the first area has a shape surrounding the receiver and the camera module.

9. The electronic device of claim 1, wherein the first area includes a first edge having a first length, a second edge having the first length and parallel to the first edge, a third edge connecting one end of the first edge and one end of the second edge, and a fourth edge connecting an opposite end of the first edge and an opposite end of the second edge,
   wherein the first group pixels are arranged along the first to fourth edges.

10. The electronic device of claim 1, wherein at least some of the first group pixels are arranged in the second area.

11. An electronic device comprising:
    a cover glass;
    a back cover facing the cover glass;
    a housing surrounding a space between the cover glass and the back cover;
    an upper end bezel arranged on one end of a plane arranged below the cover glass and having a specified shape;
    a lower end bezel arranged on an opposite end of the plane arranged below the cover glass;
    a display panel covered by and exposed through the cover glass and including a first area corresponding to the specified shape and a second area between the first area and the lower end bezel;
    a first group of screen pixels arranged in the first area;
    a second group of screen pixels arranged in the second area; and
    a display driver integrated circuit electrically connected to the first group pixels and the second group pixels,
    wherein the display driver integrated circuit transmits a disenable signal to the first group pixels to turn off the first group pixels.

12. The electronic device of claim 11, wherein a gap, which compensates a tilt between the cover glass and the display panel when the cover glass is coupled to the display panel, is arranged between the upper end bezel and the display panel.

13. The electronic device of claim 11, wherein the display driver integrated circuit transmits an enable signal to the second group of screen pixels to turn on the second group of screen pixels.

14. The electronic device of claim 11, further comprising:
    a receiver and a camera module exposed through the upper end bezel,
    wherein the specified shape surrounds at least a part of the receiver and the camera module.

15. The electronic device of claim 11, further comprising:
    a processor electrically connected to the display driver integrated circuit,
    wherein the processor turns off the first group of screen pixels through the display driver integrated circuit.

16. An electronic device comprising:
    a display panel including a display area including a plurality of a second group of screen pixels, a non-display area in which a plurality of lines connected to the plurality of the second group of screen pixels are arranged, and a peripheral area in which a first group of screen pixels are arranged between the display area and the non-display area, and wherein the first group of screen pixels are exposed through a front side of the display panel and includes a line of pixels closest to the non-display area; and
    a display driver integrated circuit configured to drive the display panel, wherein the display driver integrated circuit is configured to provide contents for display in the display area, and not provide contents to display in the peripheral area while the contents are displayed in the display area; and
another display driver configured to transmit a signal to the line of pixels closest to the non-display area.

17. The electronic device of claim 16, wherein the one or more screen pixels arranged in the peripheral area are not electrically connected to the display driver integrated circuit.

18. The electronic device of claim 16, wherein a first area includes a first edge having a first length, a second edge having the first length and parallel to the first edge, a third edge connecting one end of the first edge and one end of the second edge, and a fourth edge connecting an opposite end of the first edge and an opposite end of the second edge, and
wherein the peripheral area is connected to the first edge and wherein the line of pixels is closest to the first edge.

19. The electronic device of claim 18, further comprising:
a plurality of lines arranged between the first and second edges and each spaced apart by a specified distance,
wherein the plurality of lines are electrically connected to the second group of screen pixels arranged in the display area.

20. The electronic device of claim 16, wherein the another display driver comprises a shift register that transmits the signal to the line of pixels.

\* \* \* \* \*